(12) United States Patent
Suzuki et al.

(10) Patent No.: US 8,993,387 B2
(45) Date of Patent: *Mar. 31, 2015

(54) FLEXIBLE SEMICONDUCTOR DEVICE, METHOD FOR MANUFACTURING THE SAME, IMAGE DISPLAY DEVICE USING THE SAME AND METHOD FOR MANUFACTURING THE IMAGE DISPLAY DEVICE

(75) Inventors: Takeshi Suzuki, Osaka (JP); Koichi Hirano, Osaka (JP); Shinobu Masuda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 161 days.

This patent is subject to a terminal disclaimer.

(21) Appl. No.: 13/821,352

(22) PCT Filed: Feb. 21, 2012

(86) PCT No.: PCT/JP2012/001151
§ 371 (c)(1),
(2), (4) Date: Mar. 7, 2013

(87) PCT Pub. No.: WO2012/127779
PCT Pub. Date: Sep. 27, 2012

(65) Prior Publication Data
US 2013/0168681 A1 Jul. 4, 2013

(30) Foreign Application Priority Data
Mar. 24, 2011 (JP) .................................. 2011-066139

(51) Int. Cl.
*H01L 29/786* (2006.01)
*H01L 29/66* (2006.01)
(Continued)

(52) U.S. Cl.
CPC ........ *H01L 29/66765* (2013.01); *H01L 23/544* (2013.01); *H01L 2227/323* (2013.01);
(Continued)

(58) Field of Classification Search
USPC .......................... 257/40, 59–60, 72, E29.273; 438/149–159
See application file for complete search history.

(56) References Cited

U.S. PATENT DOCUMENTS

| | | |
|---|---|---|
| 5,821,138 A | 10/1998 | Yamazaki et al. |
| 6,376,333 B1 | 4/2002 | Yamazaki et al. |

(Continued)

FOREIGN PATENT DOCUMENTS

| | | |
|---|---|---|
| JP | 7-302881 | 11/1995 |
| JP | 2000-305109 | 11/2000 |

(Continued)

OTHER PUBLICATIONS

International Search Report issued Apr. 17, 2012 in International (PCT) Application No. PCT/JP2012/001151.

(Continued)

*Primary Examiner* — Cuong Q Nguyen
(74) *Attorney, Agent, or Firm* — Wenderoth, Lind & Ponack, L.L.P.

(57) ABSTRACT

There is provided a method for manufacturing a flexible semiconductor device. The method of the flexible semiconductor device according to the present invention comprises the steps of: (i) forming an insulating layer on one of principal surfaces of a metal foil; (ii) forming a semiconductor layer on the insulating layer, and then forming source and drain electrodes so that the source and drain electrodes contact with the semiconductor layer; (iii) forming a flexible film layer so that the flexible film layer covers the semiconductor layer and the source and drain electrodes; (iv) forming vias in the flexible film layer, and thereby a semiconductor device precursor is provided; and (v) subjecting the metal foil to a processing treatment, and thereby forming a gate electrode from the metal foil, wherein, in the step (v) of the processing treatment of the metal foil, the gate electrode is formed in a predetermined position by using at least one of the vias of the semiconductor device precursor as an alignment marker.

31 Claims, 22 Drawing Sheets

(51) Int. Cl.
  *H01L 23/544* (2006.01)
  *H01L 21/027* (2006.01)
  *H01L 27/32* (2006.01)

(52) U.S. Cl.
  CPC ... *H01L2251/5338* (2013.01); *H01L 29/78669* (2013.01); *H01L 29/78678* (2013.01); *H01L 2223/5442* (2013.01); *H01L 2223/54426* (2013.01); *H01L 27/3262* (2013.01); *H01L 21/0274* (2013.01); *H01L 29/78603* (2013.01); *H01L 29/7869* (2013.01); *H01L 2924/0002* (2013.01)
  USPC ............... 438/158; 257/40; 257/59; 257/72

(56) References Cited

U.S. PATENT DOCUMENTS

| | | | |
|---|---|---|---|
| 6,998,282 B1 | 2/2006 | Yamazaki et al. | |
| 7,288,792 B2 | 10/2007 | Yudasaka | |
| 7,361,519 B2 | 4/2008 | Yamazaki et al. | |
| 7,375,782 B2 | 5/2008 | Yamazaki et al. | |
| 8,847,229 B2 * | 9/2014 | Suzuki et al. | 257/59 |
| 2008/0309585 A1 | 12/2008 | Yamazaki et al. | |
| 2013/0292666 A1* | 11/2013 | Sonoda et al. | 257/40 |

FOREIGN PATENT DOCUMENTS

| | | |
|---|---|---|
| JP | 2004-297084 | 10/2004 |
| JP | 2005-236186 | 9/2005 |
| JP | 2007-67263 | 3/2007 |
| JP | 2010-145772 | 7/2010 |
| JP | 2010-238873 | 10/2010 |

OTHER PUBLICATIONS

International Preliminary Report on Patentability and Written Opinion of the International Searching Authority issued Oct. 3, 2013 in International (PCT) Application No. PCT/JP2012/001151.

* cited by examiner

Fig. 3
(a)
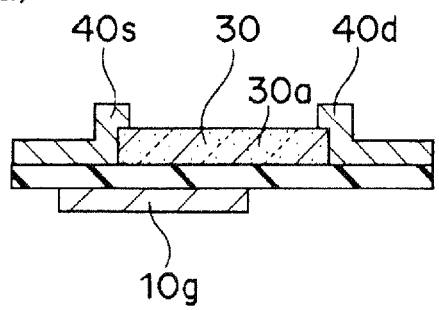 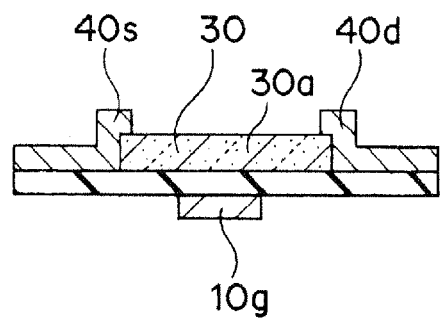
(b)
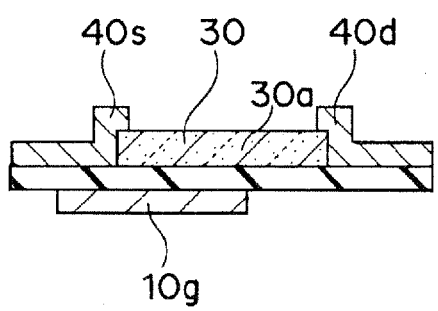 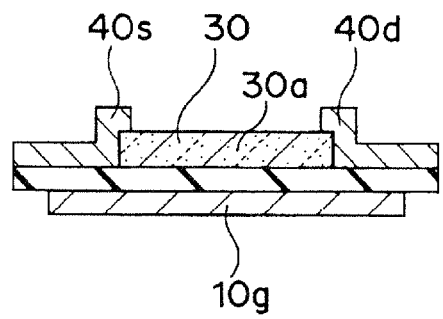
(c)
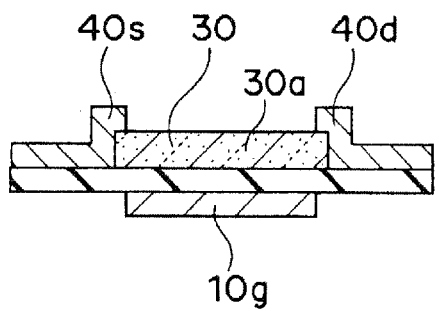

Fig. 5
(a) 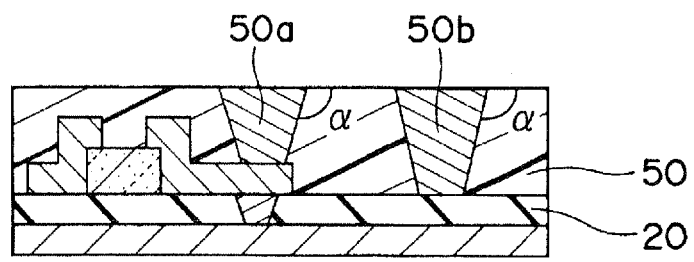
(b) 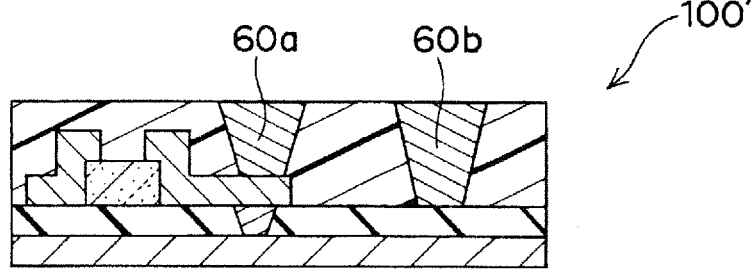
(c) 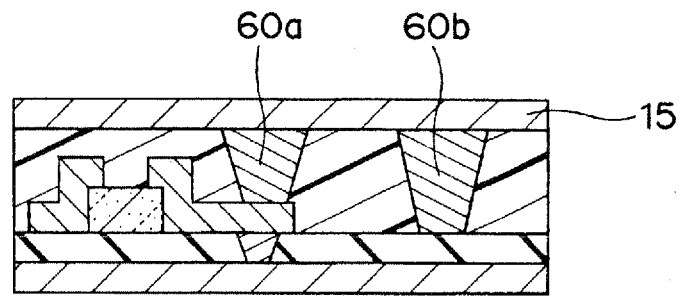
(d) 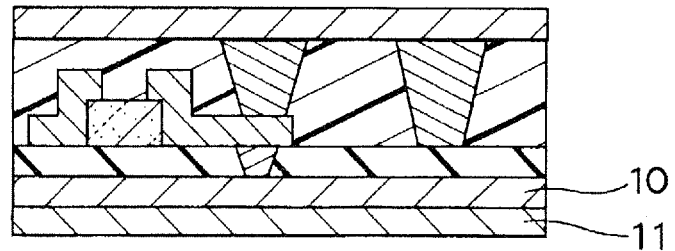

Fig. 6
(a)
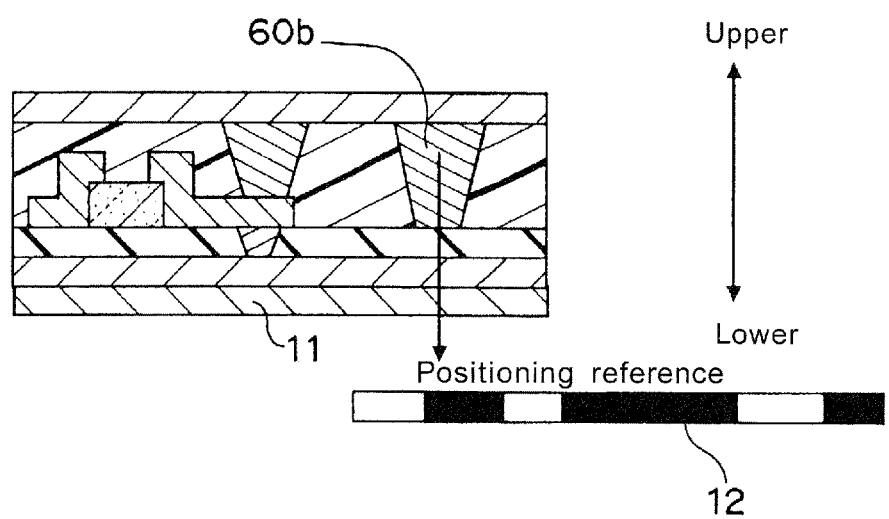
(b)
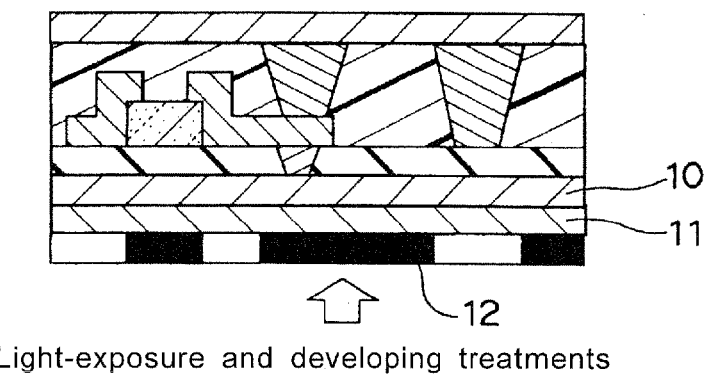
Light-exposure and developing treatments
(c)
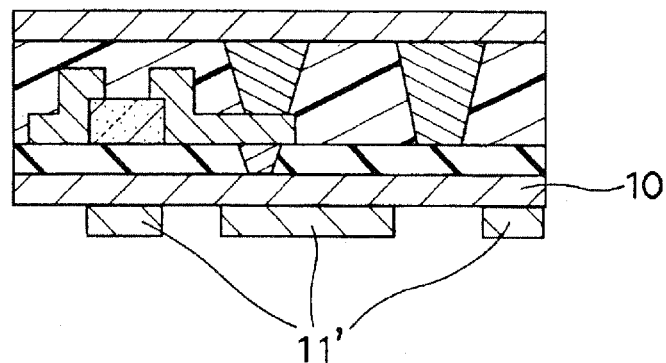

Fig. 7
(a)
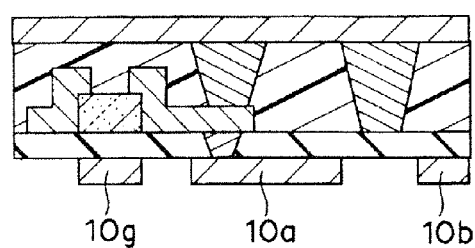
(b)
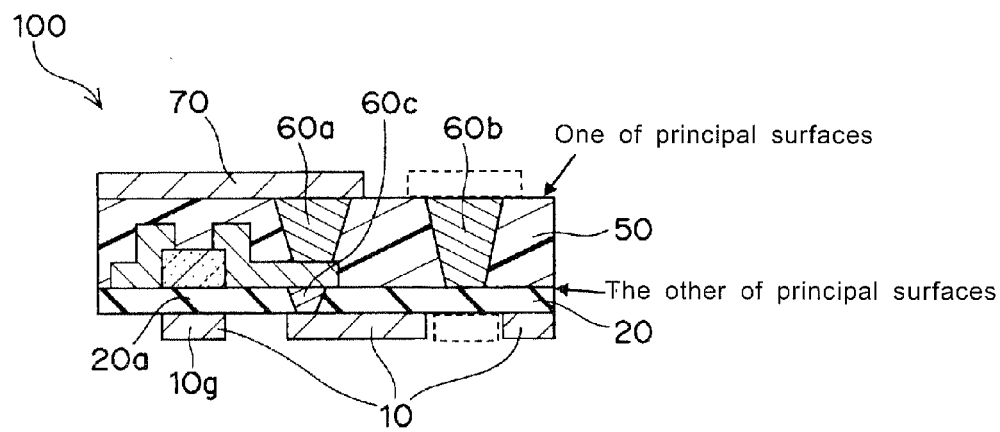

Fig. 8
Direct Light-Exposure
Formation of resist film
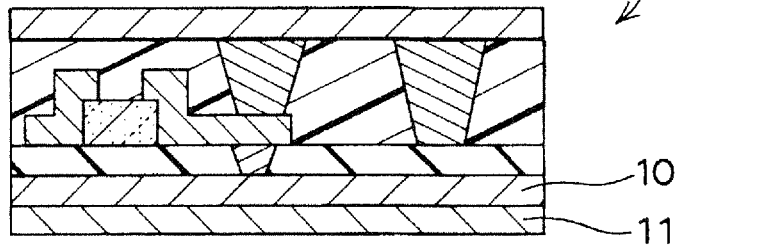
Direct light-exposure
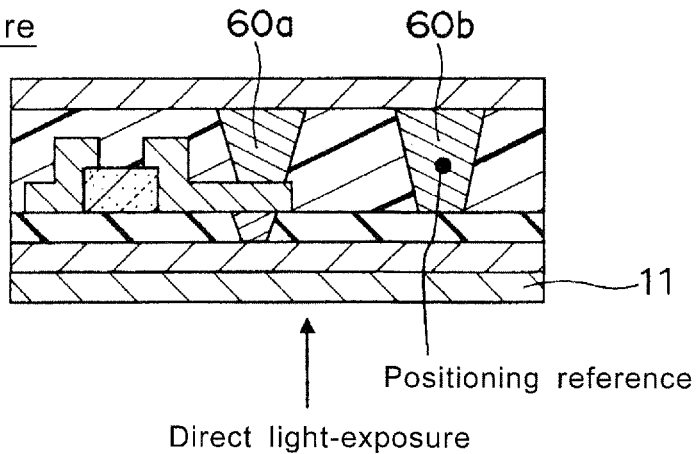
Direct light-exposure
Development
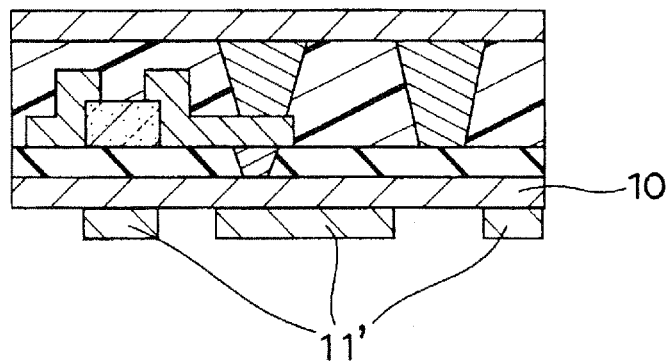

Fig. 9
(a)
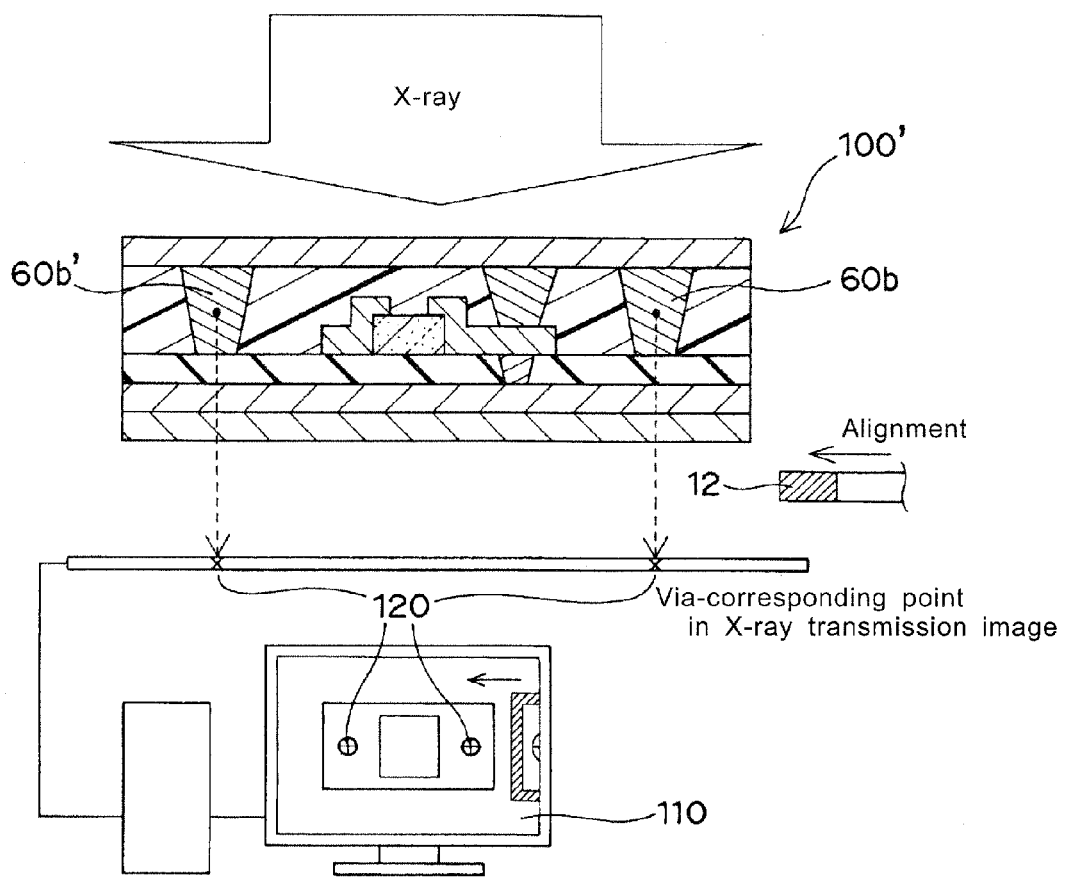
(b)
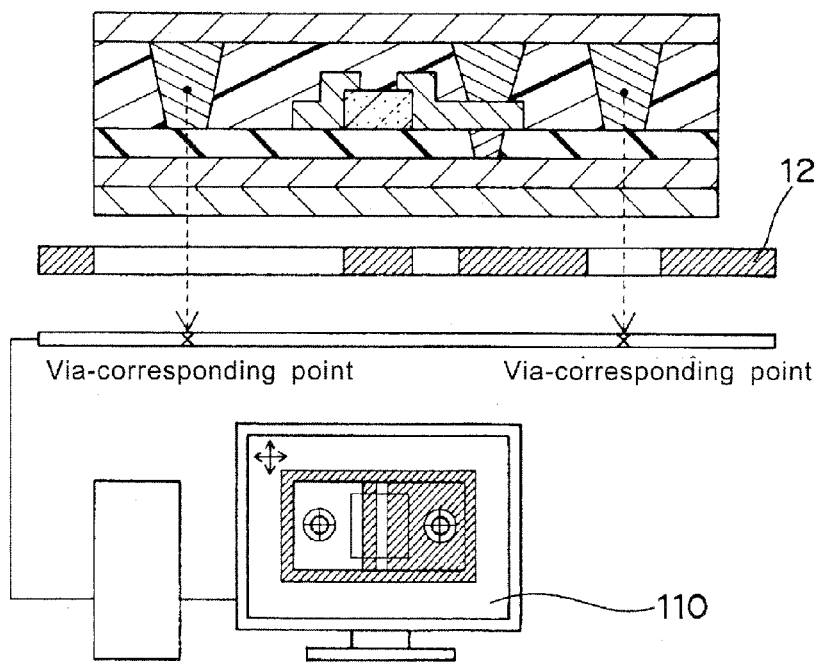

Fig. 10
(a)
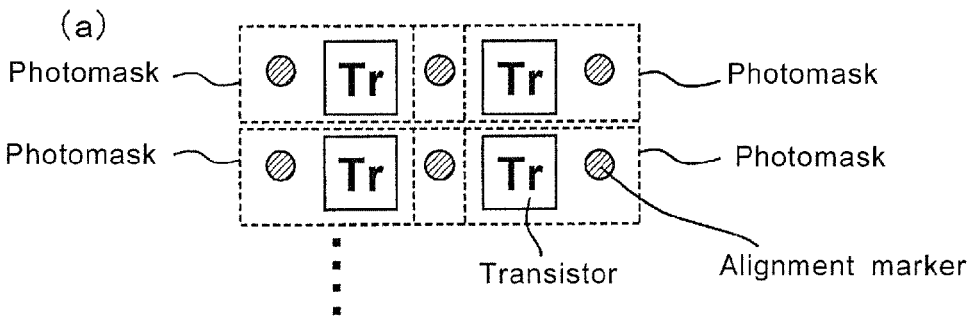
(b)
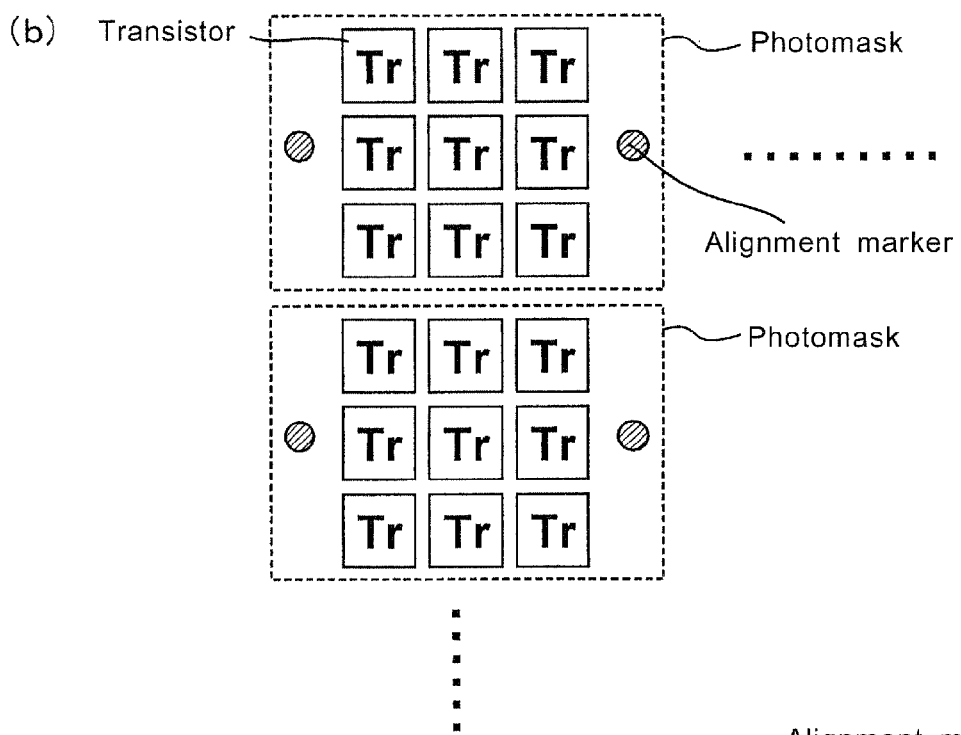
(c)
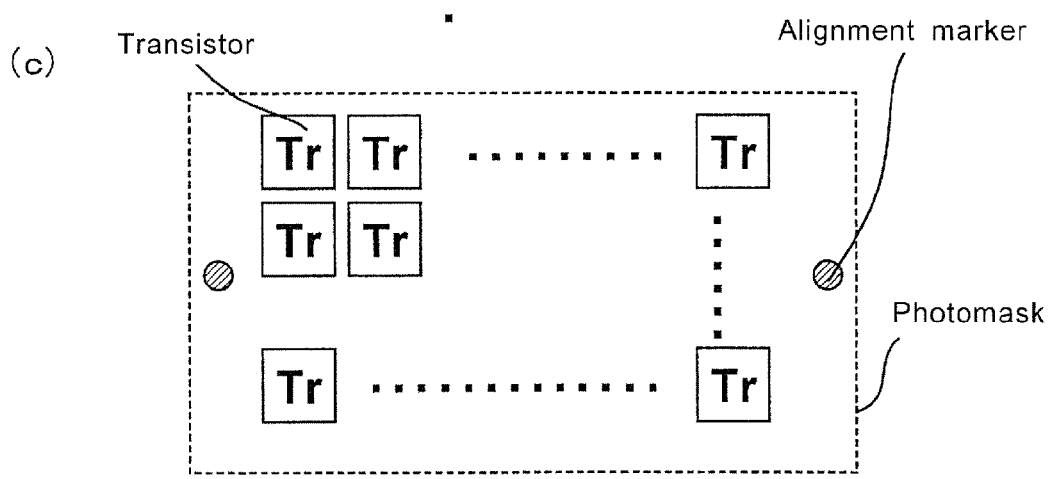

Fig. 11
(a)
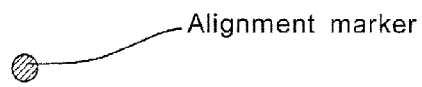
Alignment marker
(b)
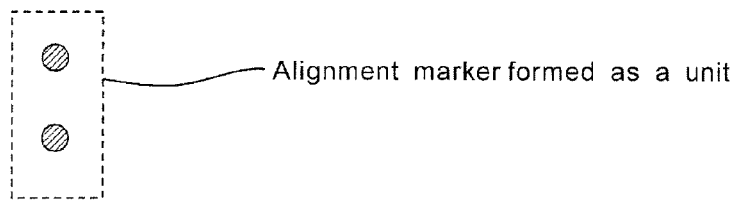
Alignment marker formed as a unit
(c)
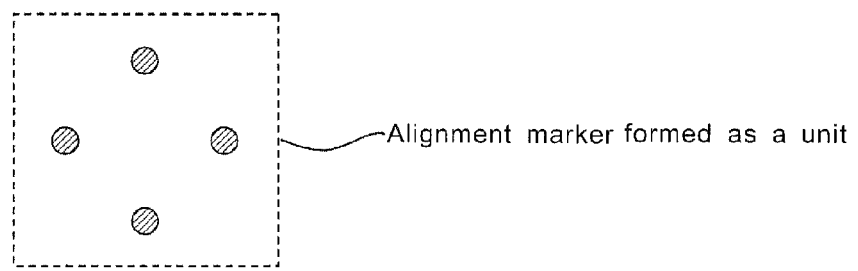
Alignment marker formed as a unit
(d)
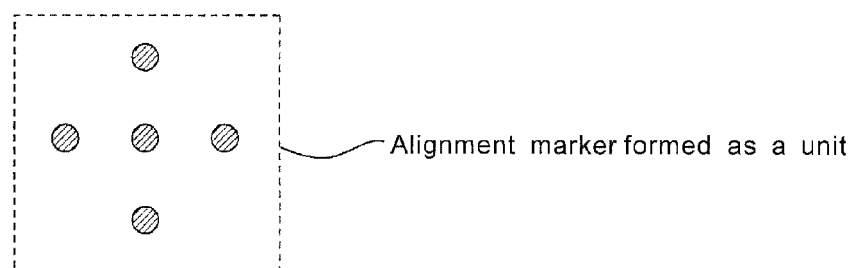
Alignment marker formed as a unit Fig. 12
(a)
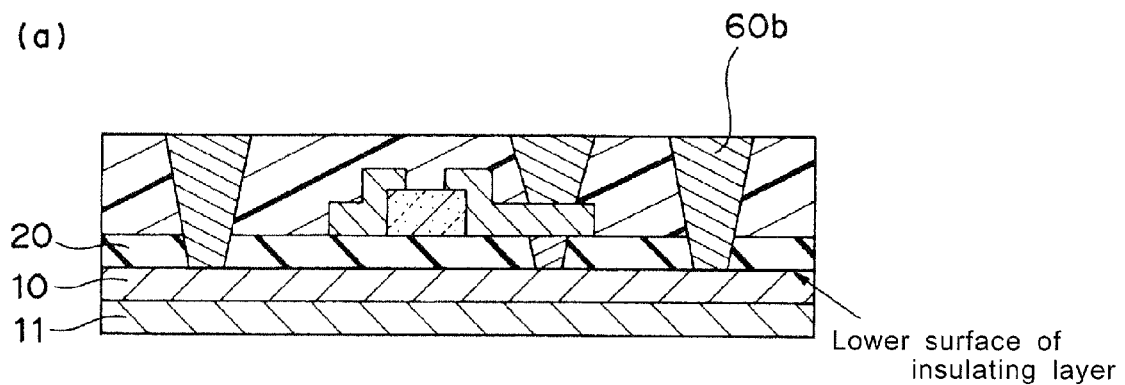
Lower surface of insulating layer
(b)
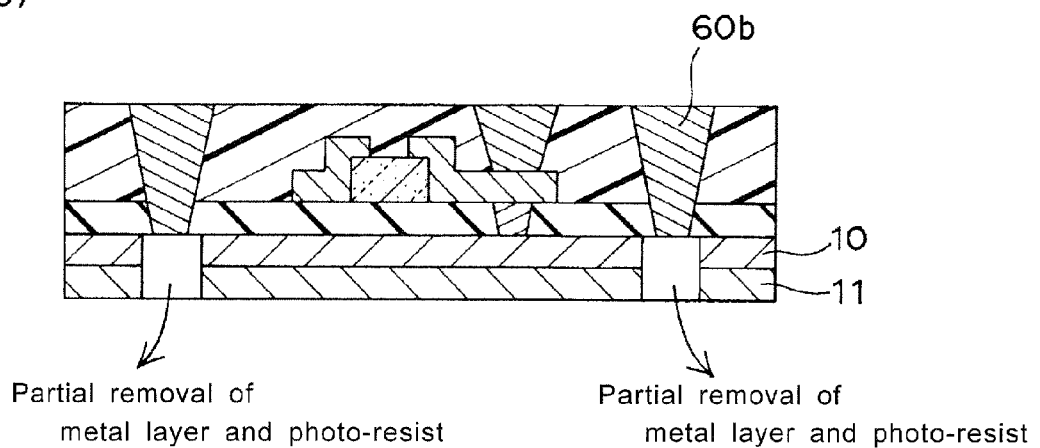
Partial removal of metal layer and photo-resist    Partial removal of metal layer and photo-resist
(c)
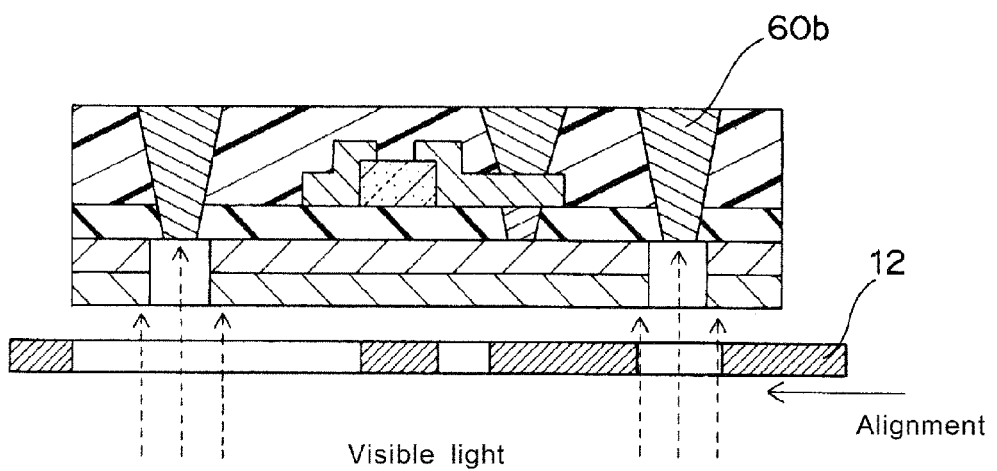
Visible light    Alignment

FLEXIBLE SEMICONDUCTOR DEVICE, METHOD FOR MANUFACTURING THE SAME, IMAGE DISPLAY DEVICE USING THE SAME AND METHOD FOR MANUFACTURING THE IMAGE DISPLAY DEVICE

TECHNICAL FIELD

The present invention relates to a flexible semiconductor device with its flexibility, and also a method for manufacturing the same. More particularly, the present invention relates to the flexible semiconductor device which can be used as a TFT, and also the method for manufacturing the same. Furthermore, the present invention relates to an image display device using such a flexible semiconductor device, and also a method for manufacturing the same.

BACKGROUND OF THE INVENTION

There is a growing need for a flat-panel display for use in a computer with a wide spreading use of information terminals. With further advancement of informatization, there are also increasing opportunities in which information, which has been conventionally provided by paper medium, is digitized. Particularly, the needs for an electronic paper or a digital paper have been recently increasing since they are thin and light weight mobile display media which can be easily held and carried (see Patent document 1, described below).

Generally, the display medium of a flat panel display device is formed by using an element such as a liquid crystal, an organic EL (organic electroluminescence) and an electrophoresis. In such display medium, a technology which uses an active drive element (TFT element) as an image drive element has become a mainstream to ensure a uniformity of the screen luminosity and a screen rewriting speed and so forth. For example, in the conventional display device for use in the computer, TFT elements are formed on a substrate wherein the liquid crystal element, the organic EL element or the like is sealed.

As a TFT element, semiconductors including a-Si (amorphous silicon) and p-Si (polysilicon) can be mainly used. These Si semiconductors (together with metal films, as necessary) are subjected to a multilayering process wherein each of a source electrode, a drain electrode and a gate electrode is sequentially stacked on the substrate, which leads to an achievement of the production of the TFT element.

Such method of manufacturing a TFT element using Si materials includes one or more steps with a high temperature, so that there is needed an additional restriction that the material of the substrate should resist a high process temperature. For this reason, it is required in practice to use a high heat-resistant glass substrate. In the meanwhile, it may also be possible to use a quartz substrate. However the quartz substrate is so expensive that an economical problem will arise when scaling up of the display panels. Therefore, the glass substrate is generally used as the substrate for forming such TFT elements.

However, when the thin display panel as described above is produced by using the conventionally known glass substrate, there is a possibility that such display panel will have a heavy weight, lack flexibility and break due to a shock when it is fallen down. These problems, which are attributable to the formation of a TFT element on the glass substrate, are so undesirable in light of the needs for a portable thin display having lighter weight with the advancement of informatization.

From the standpoint of obtaining a substrate having flexibility and light weight in order to meet the needs for a lightweight and thin display, there is developed a flexible semiconductor device wherein TFT elements are formed on a resin substrate (i.e., plastic substrate). For example, Patent document 2 (see below) discloses a technique in which a TFT element is firstly formed on a substrate (i.e., glass substrate) by a process which is almost the same as conventional process, and subsequently the TFT element is removed from the glass substrate so that it is transferred onto a resin substrate (i.e., plastic substrate). In this technique, the glass substrate wherein the TFT element is provided thereon is adhered to a resin substrate via a sealing layer (e.g., an acrylic resin layer), and subsequently the glass substrate is removed therefrom. In this way, the TFT element is transferred onto the resin substrate.

In the method for manufacturing a TFT element using such a transference process, there is, however, a problem associated with the removal of the substrate (i.e., glass substrate). In other words, it is necessary to perform an additional treatment to decrease the adhesion between the substrate and the TFT element upon the removing of the substrate from the resin substrate. Alternatively it is necessary to perform an additional treatment to form a peel layer between the substrate and the TFT element and thus also necessary to physically or chemically remove the peel layer afterward. These additional treatments can make the process complicated, which may cause a productivity problem.

PATENT DOCUMENTS (PRIOR ART PATENT DOCUMENTS)

[Patent document 1] Japanese Unexamined Patent Publication (Kokai) No. 2007-67263; and
[Patent document 2] Japanese Unexamined Patent Publication (Kokai) No. 2004-297084.

SUMMARY OF THE INVENTION

Problems to be Solved by the Invention

In the production of the flexible semiconductor device, it is considered to directly form a TFT element on the resin substrate (or plastic plate), not transferring the TFT element onto the resin substrate. In this case, the removing step of the supporting plate (i.e., glass substrate) after the transferring becomes unnecessary, and thus the flexible semiconductor device can be simply and easily manufactured.

However, since the resin substrate made of the acrylic resin or the like has a low heat-resistance, the process temperature is restricted to be kept as low as possible upon producing the TFT elements. Therefore, the TFT element which has been directly formed on the resin substrate can cause a concern in terms of a lowered TFT performance, as compared with that of the TFT elements obtained through the transference process.

For example, it is desired to subject the semiconductor material to a heat treatment in order to improve the semiconductor properties (e.g., mobility). However, in the case where the TFT element is directly formed on the resin substrate, it is difficult to adopt such heat treatment because of the restricted process temperature. Moreover, in order to decrease a gate voltage, it is desired to use, as a gate insulating film, an inorganic oxide with not only its high dielectric strength voltage, but also its thin thickness and moreover its high dielectric constant. However, such inorganic oxide can cause such a challenging problem to be improved in terms of the production thereof that it is not easy to perform a machining process (e.g., laser machining process for forming a hole) due to the fact that the inorganic oxides generally have a densified form and a high chemical stability. In particular, such problem becomes severe when it comes to the flexible semiconductor device used for a large sized screen.

The inventors of the present application tried to dissolve such problems not by following up the conventional way, but by focusing on a new way. The present invention has been accomplished in view of the above matters, and thus a main object of the present invention is to provide a method for manufacturing a flexible semiconductor device which is excellent in productivity, and also to provide a flexible semiconductor device with a high performance by such method.

Means for Solving the Problem

In order to achieve the above-mentioned object, the present invention provides a flexible semiconductor device comprising:
 a metal foil;
 an insulating layer provided on the metal foil;
 a semiconductor layer provided on the insulating layer;
 source and drain electrodes provided on the insulating layer, the source and drain electrodes being in contact with the semiconductor layer; and
 a flexible film layer disposed such that the semiconductor layer and the source and drain electrodes are covered with the flexible film layer,
 wherein a part of the metal foil is a gate electrode, and a part of the insulating layer is a gate insulating film, and
 wherein the flexible film layer is provided with a plurality of vias extending in a thickness direction thereof, at least one of the vias being an alignment marker (i.e., positioning marker).

The term "flexible" of the "flexible semiconductor device" used in the present description substantially means that the semiconductor device has such flexibility characteristic that the device can be inflected. The "flexible semiconductor device" of the present invention may also be referred to as "flexible semiconductor element", in view of the structure thereof.

The term "plurality" of the phrase "a plurality of vias" used in the present description substantially means the number of the vias which can be generally provided in the conventional flexible semiconductor device (e.g., TFT element). The concrete number of the vias depends on an application of the flexible semiconductor device (TFT element). Take an image display device as an example, the number of the vias can be in the range of about 150000 to 70000000 in the light of the fact that the number of pixels of the general image display device is for example in the range of about 76800 (320×240) to about 35000000 (8192×4320), and that two vias are provided per pixel.

One of the characterizing features of the flexible semiconductor device according to the present invention is that at least one of the vias is an alignment marker. The term "alignment" as used in the present invention means an alignment (i.e., positioning) regarding a relative positional relationship among various constituent elements of the flexible semiconductor device or a relative positional relationship among various elements associated with the flexible semiconductor device.

In one preferred embodiment, the alignment marker is provided as a unit of at least two of the vias. In other words, a group of at least two of the vias substantially serves as the alignment marker.

In another preferred embodiment, the at least one of the vias has a taper shape in a thickness direction thereof. This means that the via serving as the alignment marker has a taper shape along a thickness direction of the via.

In still another preferred embodiment, the at least one of the vias extends from one of the principal surfaces of the flexible film layer to the other of the principal surfaces thereof. Specifically, the via serving as the alignment marker extends one of the principal surfaces of the flexible film layer to the other of the principal surfaces thereof through the flexible film layer.

In still another preferred embodiment, the at least one of the vias is an electrically-conductive part which comprises a metal.

Such flexible substrate with the via serving as the alignment marker contained therein can be described as follows, for example:
The flexible substrate comprising:
 a metal foil;
 an insulating layer provided on the metal foil;
 a semiconductor layer provided on the insulating layer;
 source and drain electrodes provided on the insulating layer, the source and drain electrodes being in contact with the semiconductor layer; and
 a flexible film layer disposed such that the semiconductor layer and the source and drain electrodes are covered with the flexible film layer,
 wherein a part of the metal foil is a gate electrode, and a part of the insulating layer is a gate insulating film, and
 wherein the flexible film layer is provided with a plurality of vias extending in a thickness direction thereof, and a partially removed portion of the metal foil is provided at a position of at least one of the vias.

It is preferred in this flexible semiconductor device that the insulating layer has an upper principal surface and a lower principal surface opposed to the upper principal surface, the upper principal surface being in contact with the flexible film layer, and that the at least one of the vias (i.e., alignment marker via) extends from the upper principal surface of the insulating layer to the lower principal surface of the insulating layer.

In the flexible substrate according to one embodiment of the present invention, the metal foil is in a form of a metal layer. In other words, the flexible semiconductor device can be described as follows:
The flexible semiconductor device comprising:
 a metal layer;
 an insulating layer provided on the metal layer;
 a semiconductor layer provided on the insulating layer;
 source and drain electrodes provided on the insulating layer, the source and drain electrodes being in contact with the semiconductor layer; and
 a flexible film layer disposed such that the semiconductor layer and the source and drain electrodes are covered with the flexible film layer,
 wherein a part of the metal layer is a gate electrode, and a part of the insulating layer is a gate insulating film, and
 wherein the flexible film layer is provided with a plurality of vias extending in a thickness direction thereof, and at least one of the vias being an alignment marker.
The flexible semiconductor device comprising:
 a metal layer;
 an insulating layer provided on the metal layer;
 a semiconductor layer provided on the insulating layer;
 source and drain electrodes provided on the insulating layer, the source and drain electrodes being in contact with the semiconductor layer; and a flexible film layer disposed such that the semiconductor layer and the source and drain electrodes are covered with the flexible film layer, wherein a part of the metal layer is a gate electrode, and a part of the insulating layer is a gate insulating film, and wherein the flexible film layer is provided with a plurality of vias extending in a thickness direction thereof, and a partially removed portion of the metal layer is provided at a position of at least one of the vias.

The present invention further provides a method for manufacturing the above flexible semiconductor device. The manufacturing method of the present invention comprises the steps of:

(i) forming an insulating layer on one of principal surfaces of a metal foil;

(ii) forming a semiconductor layer on the insulating layer, and then forming source and drain electrodes so that the source and drain electrodes contact with the semiconductor layer;

(iii) forming a flexible film layer so that the flexible film layer covers the semiconductor layer and the source and drain electrodes;

(iv) forming vias in the flexible film layer, and thereby a semiconductor device precursor is provided; and (v) subjecting the metal foil to a processing treatment, and thereby forming a gate electrode from the metal foil, wherein, in the step (v) of the processing treatment of the metal foil, the gate electrode is formed in a predetermined position by using at least one of the vias of the semiconductor device precursor as an alignment marker (i.e., positioning marker).

One of the characterizing features of the manufacturing method according to the present invention is that at least one of the vias of the semiconductor device precursor is used as the alignment marker, and thereby the gate electrode is formed in the predetermined position. This means that the via of the semiconductor device precursor is used as a positioning reference to accurately form the gate electrode in the predetermined position.

The phrase "the gate electrode is formed in a predetermined position" as used in the present invention means that the gate electrode is formed in a desired position as originally intended. More specifically, such phrase means that the gate electrode is formed in such a suitable position that the manufactured flexible semiconductor device can function as a TFT. As an example of "the gate electrode is formed in a predetermined position", the gate electrode is formed in an opposed to a channel with no misalignment therebetween such that the formed gate electrode is positioned in an overlapping relation with the channel.

In one preferred embodiment, the step (v) comprises:

(v1) forming a photo-resist film on the other of the principal surfaces of the metal foil;

(v2) subjecting the photo-resist film to a light-exposure treatment and a developing treatment, and thereby removing at least part of the photo-resist film; and (v3) subjecting the metal foil to an etching treatment via the photo-resist film at least part of which has been removed, and thereby forming the gate electrode from the metal foil, wherein, in the step (v2) of the light-exposure treatment of the photo-resist film, a predetermined position of the photo-resist film is exposed to the light by using the at least one of the vias of the semiconductor device precursor as the alignment marker. In this embodiment, a direct exposure of the photo-resist film can be suitably performed so that the gate electrode is formed in a desired position, which leads to an accurate formation of the gate electrode in the predetermined position. In other words, the gate electrode can be accurately formed in the predetermined position with respect to the channel portion of the TFT structure in the flexible semiconductor device by the alignment performed upon the direct light-exposure of the photo-resist film. Similarly, the phrase "predetermined position of the photo-resist film is exposed to the light" means that a desired local region of the photo-resist film is exposed to the light as originally intended. More specifically, such phrase means that the local region of the photo-resist film is exposed to the light such that the gate electrode is formed in such a suitable position that the manufactured flexible semiconductor device can function as a TFT.

It is possible in the step (v2) (i.e., the step of subjecting the photo-resist film to the light-exposure treatment and the developing treatment, and thereby removing at least part of the photo-resist film) that a photomask is disposed on the photo-resist film, and thereafter the photo-resist film with the photomask disposed thereon is subjected to the light-exposure and developing treatments to remove at least part of the photo-resist film. In this case, it is preferred that, instead of using the alignment marker upon subjecting the photo-resist film to the light-exposure treatment, an alignment of the photomask is performed upon the disposing thereof by using the at least one of the vias of the semiconductor device precursor as the alignment marker. In so doing, the light-exposure and developing treatments of the photo-resist film through the photomask can be suitably performed in the predetermined portion of the photo-resist film with no misalignment, which leads to an accurate formation of the gate electrode in the predetermined position. Similarly, the phrase "alignment of the photomask is performed at a predetermined position" as used in this embodiment means that the photomask is disposed in a desired position as originally intended. More specifically, such phrase means that the photomask is disposed in such a suitable position that the manufactured flexible semiconductor device can function as a TFT.

Upon the processing treatment of the metal foil, the light-exposure treatment of the photo-resist film or the disposing of the photomask, a X-ray transmission image obtained by irradiating the semiconductor device precursor with a X-ray may be used wherein a via-corresponding point in the X-ray transmission image may be used as a positioning reference. In particular, it is preferred that at least two of the vias are used as a unit which constitutes the alignment marker, and thus the via-corresponding points in the X-ray transmission image, which correspond to the vias of the unit, are preferably used as the positioning reference.

In one preferred embodiment, in the step (iv) of forming the via, an opening is formed in the flexible film layer, and thereafter an electrically-conductive material with a metal contained therein is supplied into the opening to form the via.

The present invention further provides an image display device using the above flexible semiconductor device. The image display device comprises:

the flexible semiconductor device; and an image display unit composed of a plurality of pixels, the unit being provided over the flexible semiconductor device, wherein at least one of the vias provided in the flexible semiconductor device is an alignment marker (i.e., positioning marker).

One of the characterizing features of the image display device according to the present invention is that at least one of the vias provided in the flexible semiconductor device is an alignment marker.

In one preferred embodiment, the image display unit comprises:
a pixel electrode provided on the flexible semiconductor device;
a light emitting layer provided over the pixel electrode; and
a transparent electrode layer provided on the light emitting layer. In this embodiment, the light emitting layer is provided at a region partitioned by a pixel regulating part. Namely, the image display unit can comprise:
the flexible semiconductor device; and
the pixel electrode provided on the flexible semiconductor device;
a plurality of the light emitting layers provided at the regions partitioned by the pixel regulating part, the light emitting layers being provided over the pixel electrode;
the transparent electrode layer provided on the plurality of the light emitting layers,
wherein at least one of the vias provided in the flexible semiconductor device is the alignment marker. The image display unit may comprise a color filter provided on the transparent electrode layer. Namely, the image display unit can comprise:
the flexible semiconductor device; and
the pixel electrode provided on the flexible semiconductor device;
the light emitting layer provided over the pixel electrode;
the transparent electrode layer provided on the light emitting layer; and
the color filter provided on the transparent electrode layer,
wherein at least one of the vias provided in the flexible semiconductor device is the alignment marker.

Furthermore, the present invention provides a method for manufacturing the above image display unit. Such manufacturing method comprises the steps of:

(I) providing the flexible semiconductor device equipped with a pixel electrode; and (II) forming an image display unit composed of a plurality of pixels over the flexible semiconductor device, wherein, in the step (II), an alignment of the image display unit is performed upon the formation thereof by using at least one of the vias of the flexible semiconductor device as an alignment marker (i.e., positioning marker).

One of the characterizing features of the manufacturing method of the image display device according to the present invention is that the alignment of the image display unit is suitably performed upon the formation thereof by using at least one of the vias of the flexible semiconductor device as the alignment marker. For example in a case where a plurality of pixel regulating parts are formed, and then the pixels are formed on regions of the pixel electrode in the step (II), the regions being partitioned by the pixel regulating parts, an alignment of the pixel regulating parts may be formed upon the formation thereof by using at least one of the vias of the flexible semiconductor device as the alignment marker. In so doing, an alignment of the photomask for forming the pixel regulating parts can be suitably performed, and thereby the light emitting layer can be formed with no misalignment. In other words, the light emitting layer can be accurately formed in the predetermined position with respect to the pixel (i.e., circuit with TFT contained therein). Alternatively, in a case where the light emitting layer is formed over the pixel electrode such that the light emitting layer covers the pixel electrode, and then a color filter is formed on the light emitting layer in the step (II), an alignment of the color filter may be performed upon the formation thereof by using at least one of the vias of the flexible semiconductor device as the alignment marker.

Effect of the Invention

In accordance with the present invention, a suitable alignment regarding a relative positional relationship among various constituent elements of the flexible semiconductor device or a relative positional relationship among various constituent elements of the image display device using the flexible semiconductor device can be achieved. For example, the gate electrode can be accurately formed in the predetermined position with respect to the channel of the TFT structure of the flexible semiconductor device. Moreover, the light-emitting layer can be accurately formed in the predetermined position with respect to the pixel (i.e., circuit with TFT contained therein) of the image display device.

The alignment marker can be easily formed upon the formation of the required elements (e.g., contact via) of the flexible semiconductor device. Further, the improved alignment attributed to the alignment marker can improve a production yield of the flexible semiconductor or image display devices. This means that the present invention can provide a high productivity of the manufacturing method. Furthermore, the flexible semiconductor device or the image display device according to the present invention can have a high performance since the alignment marker enables the various constituent elements to be accurately positioned with no misalignment.

BRIEF DESCRIPTION OF THE DRAWINGS

FIG. 3 is a cross sectional view schematically illustrating a relative positional relationship between the gate electrode and the channel.

FIGS. 5(a) to 5(d) are cross sectional views schematically illustrating the steps in a manufacturing process of a flexible semiconductor device according to an embodiment of the present invention.

FIGS. 6(a) to 6(c) are cross sectional views schematically illustrating the steps in a manufacturing process of a flexible semiconductor device according to an embodiment of the present invention.

FIGS. 7(a) and 7(b) are cross sectional views schematically illustrating the steps in a manufacturing process of a flexible semiconductor device according to an embodiment of the present invention.

FIG. 8 is a view schematically illustrating an embodiment wherein a direct exposure is performed.

FIGS. 9(a) and 9(b) are cross sectional views schematically illustrating an embodiment wherein an alignment of photomask is performed by using X-ray transmission image of an alignment marker.

FIGS. 10(a) to 10(c) are schematic illustrations for showing dispositions of alignment markers.

FIG. 11 is a schematic illustration for showing alignment markers provided as a unit.

FIGS. 12(a) to 12(c) are views schematically illustrating an embodiment wherein an alignment of photomask is performed by making use of visible light.

EXPLANATION OF REFERENCE NUMERALS

Figure 1:
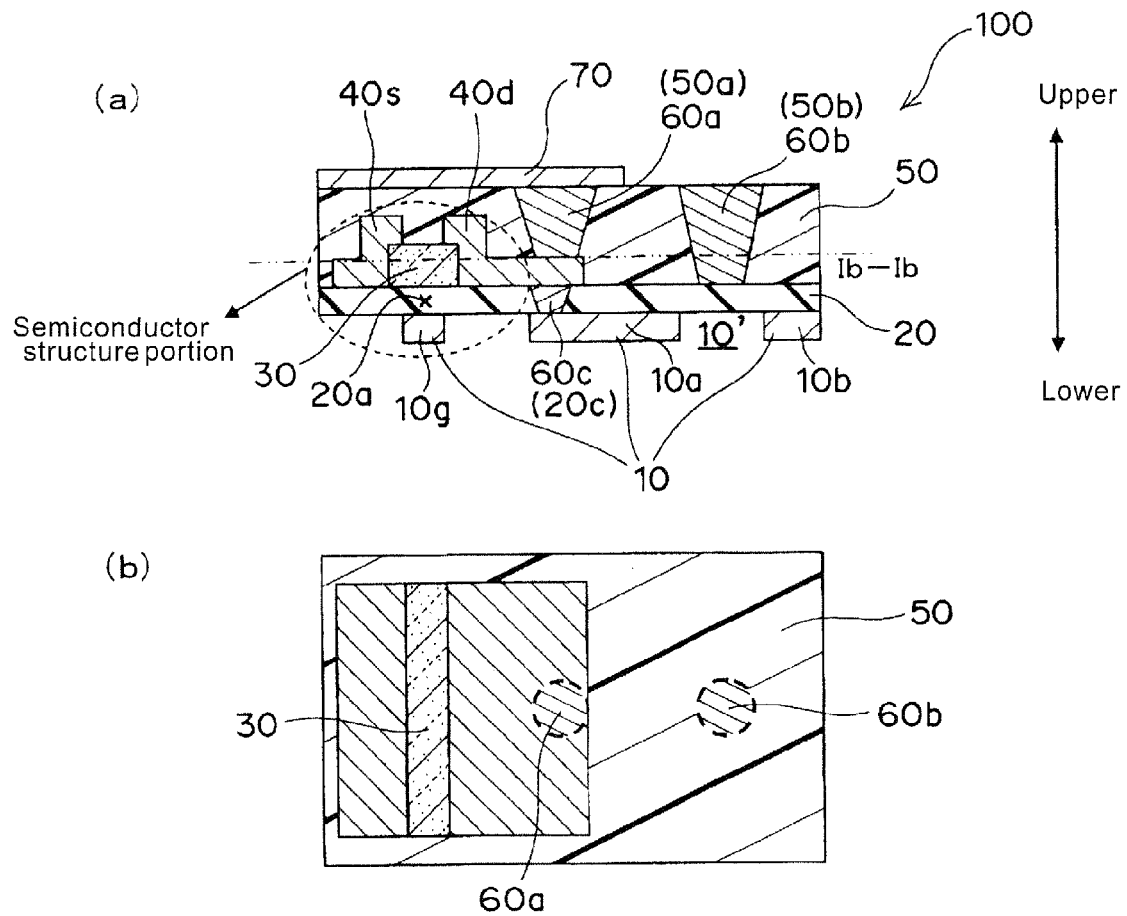
FIG. 1(a) is a cross sectional view schematically illustrating a flexible semiconductor device according to an embodiment of the present invention.
FIG. 1(b) is a plan view illustrating the flexible semiconductor device taken along a line Ib-Ib of FIG. 1(a).

10: Metal layer or metal foil (Lower metal layer or lower metal foil)
10g: Gate electrode
10a, 10b: Wiring made of metal layer
12: Photomask
15: Metal layer or metal foil (Upper metal layer or upper metal foil)
20: Insulating layer (Insulating film)
20a: Gate insulating film (Gate insulating layer)
20c: Via opening provided in insulating layer
30: Semiconductor layer
40s, 40d: Source electrode, Drain electrode
50: Flexible film layer
50a, 50b: Openings provided in flexible film layer
60: Via
60a: Contact via (Via)
60b: Alignment marker (Via)
60c: Interlaminar connecting portion
70: Wiring layer and/or Pixel electrode
80: Display portion
82: Wiring
85: Capacitor
90: Driving circuit
92: Data line
93: Power-supply line
94: Selection line
100, 100a, 100b: Flexible semiconductor device
100': Semiconductor device precursor
110: X-ray transmission image
120: Via-corresponding point
150: Pixel electrode
160: Pixel regulating part
160': Pixel regulating part precursor
165: Photomask used for formation of pixel regulating part
170: Light emitting layer
180: Transparent electrode layer
190: Color filter
200: Image display device
200': Image display device

DETAILED DESCRIPTION OF THE INVENTION

Hereinafter, some embodiments of the present invention will be described with reference to Figures. For simplified explanation, the same reference numeral of the following Figures indicates the element which has substantially the same function. The dimensional relationship (length, width, thickness and so forth) in each Figure does not reflect a practical relationship thereof.

Each "direction" referred to in the present description means the direction based on the spacial relationship between the metal layer 10 and the semiconductor layer 30, in which each of upward direction and downward direction is mentioned relating to the direction in the drawings for convenience. Specifically, the upward direction and the downward direction respectively correspond to the upward direction and the downward direction in each drawing. The side on which the semiconductor layer 30 is formed based on the metal layer 10 is referred to as "upward direction" and the side on which the semiconductor layer 30 is not formed based on the metal layer 10 is referred to as "downward direction".

<<Flexible Semiconductor Device>>

With reference to FIGS. 1(a) and (b), the flexible semiconductor device 100 according to one embodiment of the present invention will be explained. FIG. 1(a) is a schematic sectional structure of the flexible semiconductor device 100 whereas FIG. 1(b) is a plan view of the device taken along a line Ib-Ib of FIG. 1(a).

The device of the present invention is a flexible semiconductor device 100 equipped with a flexible film. As illustrated in FIGS. 1(a) and 1(a), the flexible semiconductor device 100 comprises a semiconductor structure portion and a film layer 50 formed so as to cover the semiconductor structure portion. More specifically, the flexible semiconductor device 100 of the present invention comprises a metal layer 10, an insulating layer 20 formed on the metal layer 10, a semiconductor layer 30 formed on the insulating layer 20, source and drain electrodes 40s, 40d formed on the insulating layer, source and drain electrodes being in contact with the semiconductor layer 30, and a flexible film layer 50 formed such that the semiconductor layer 30 and the source and drain electrodes 40s, 40d are covered with the flexible film layer. The gate electrode 10g is made of a part of the metal layer 10, and the gate insulating film 20a is made of a part of the insulating layer 20 in the flexible semiconductor device 100 of the present invention.

Figure 2:
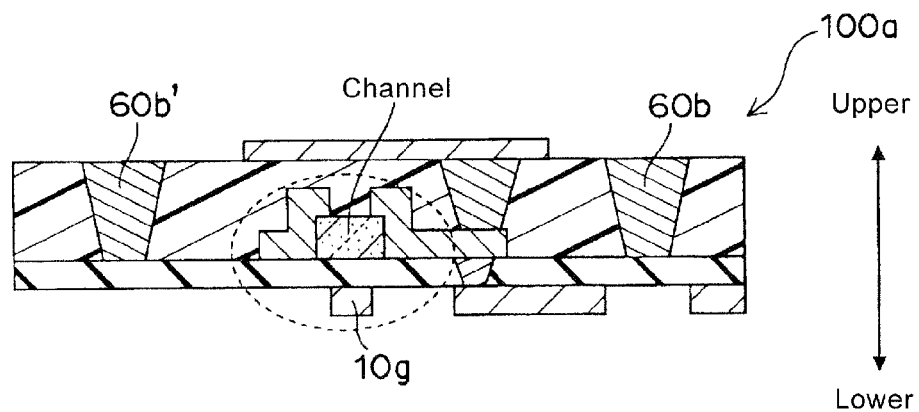
FIG. 2 is a cross sectional view schematically illustrating a flexible semiconductor device according to an embodiment of the present invention.
Figure 4:
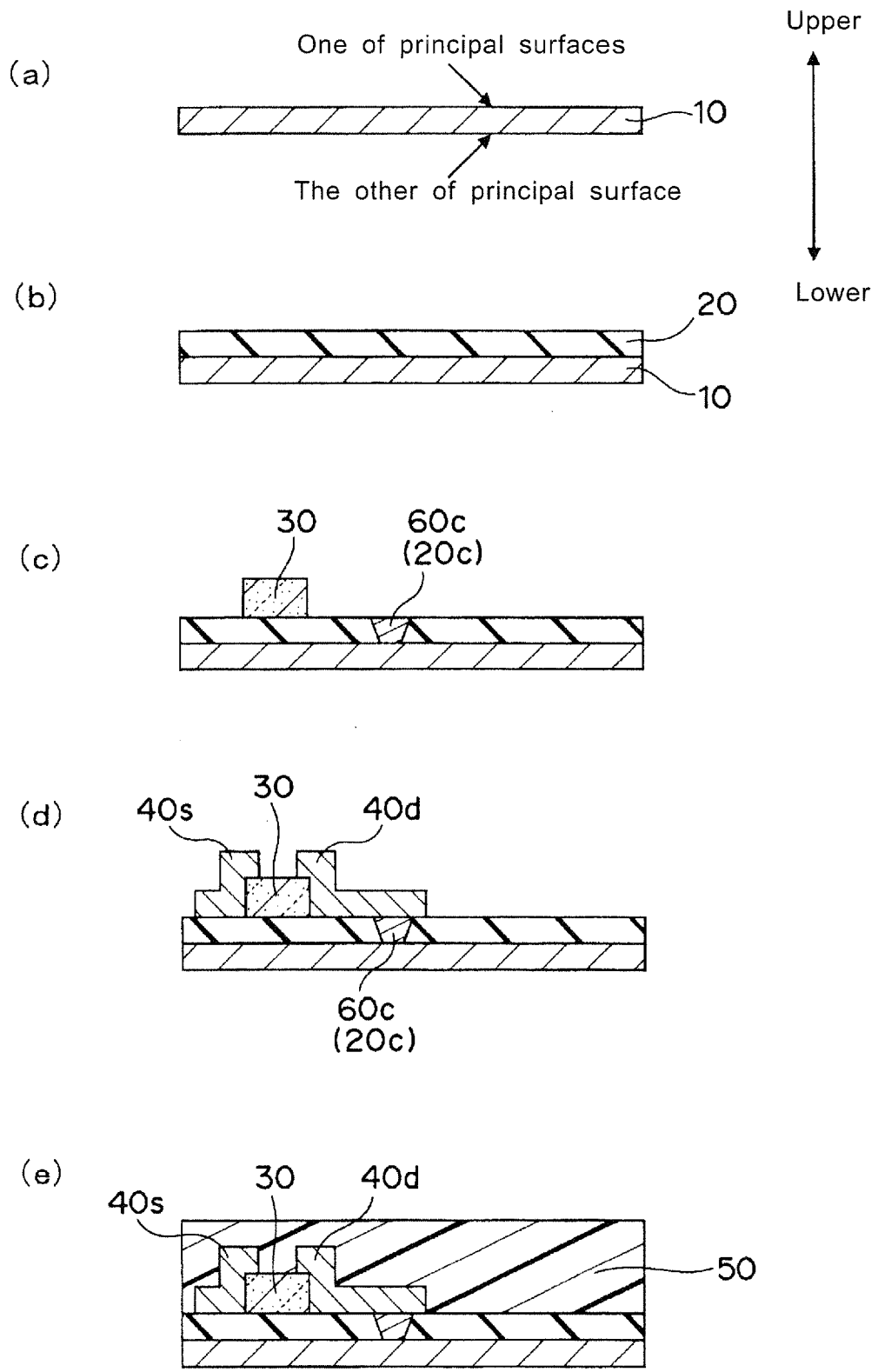
FIGS. 4(a) to 4(e) are cross sectional views schematically illustrating the steps in a manufacturing process of a flexible semiconductor device according to an embodiment of the present invention.

As seen from a sectional view of the device, the film layer 50 of the flexible semiconductor device 100 according to the present invention has an opening 50a and an opening 50b formed therein. The opening 50a extends between the upper surface of the semiconductor structure portion and the upper surface of the semiconductor device 100. The opening 50b extends between the upper surface of the insulating layer 20 and the upper surface of the semiconductor device 100. The openings 50a, 50b are respectively provided with electrically-conductive parts formed therein. The electrically-conductive part in the opening 50a serves as a contact via 60a which connects between a circuit provided in a layer of the semiconductor structure portion and a circuit provided on the resin film. While on the other hand, the electrically-conductive part in the opening 50b serves not as the contact via but as an alignment marker 60b (which will be described later) although it is similar to that of the opening 50a in terms of the use of an electrically-conductive material. Thus, the flexible film layer 50 of the present invention 100 is provided with a plurality of vias extending in a thickness direction of the film layer, wherein at least one of the vias is the alignment marker (i.e., "positioning marker"). FIG. 1 illustrates an embodiment wherein only the via 60b is the alignment marker, whereas FIG. 2 illustrates an embodiment wherein two vias (60b, 60b') are provided as the alignment markers.

The film layer 50 is preferably made of a resin material which has flexibility. It is thus preferred that the flexible film layer 50 is a resin film. This resin film can serve as a supporting substrate for supporting the semiconductor structure portion (or TFT structure therewith) and is preferably made of a thermoplastic resin material or a thermosetting resin material having flexibility characteristic after being cured. Moreover, it is particularly preferred in the present invention that the resin film is adapted for the formation of the opening. Examples of the resin film preferably include at least one resin selected from the group consisting of an epoxy resin, a polyimide resin, an acrylic resin, a polyethylene terephthalate resin, a polyethylenenaphthalate resin, a polyphenylene sulfide resin, a polyphenylene ether resin, a liquid crystal polymer and a polytetrafluoroethylene. Just as an example, the resin film may be a polyimide film. These resin materials are excellent in the dimensional stability and thus is preferably used as a flexible material of the flexible semiconductor device. For forming the opening in the resin film, a laser processing may be adopted by using a carbon dioxide laser, YAG laser or the like. A photolithography may also be adopted so as to form the opening in the resin film. In this case, a resin material suitable for the photolithography (e.g., resin film made of photosensitive resin) is preferably used. Furthermore, an inorganic polymer material film, e.g., a siloxane polymer film can be suitably used as the flexible film layer 50 since it has a flexibility and is appropriate for the formation of the opening.

Just as an example, in a case where an adhesive material is provided on a bonded surface of the flexible film layer, the flexible film layer may have a thickness of about 2 μm to about 100 μm and the adhesive material layer may have a thickness of about 3 μm to about 20 μm.

The electrically-conductive part of the flexible semiconductor device 100 has an identification capability serving as the alignment marker as well as an electrically-conductive capability serving as a contact via. For example, in a case where X-ray is used for the alignment marker (which will be described later), it is preferred that the electrically-conductive part comprises a metal component.

As for the electrically-conductive parts (i.e., vias 60a,60b) provided within the openings 50a,50b of the flexible film layer 50, those made from an electroconductive paste material are preferable in terms of cost and productivity. As the electroconductive paste material, the paste material obtained by dispersing a single metal such as Au, Ag, Cu, Pt, Pd, Al and/or Pb, the mixture or alloy thereof, an electroconductive filler such as a carbon filler, a carbon nanotubes and the like into a binder which contains an organic resin (e.g., an epoxy resin) and/or a solvent (e.g., butylcarbitol acetate (BCA)). The electroconductive parts (vias 60a,60b) can be provided through filling the openings 50a,50b with such electroconductive paste material.

It is also possible to fill a metal (e.g., Au, Ag, Cu, Ni, Co, Cr, Mn, Fe, Ru, Rh, Pd, Ag, Os, Ir and/or Pt) in the openings 50a,50b by performing a plating process for the purpose of forming the electrically-conductive parts (i.e., vias 60a,60b). In particular, a Cu plating process is preferred since it is comparatively inexpensive and the metal Cu in itself has a high electroconductivity. In this regard, the metal Cu is preferred in terms of the identification capability upon the X-ray irradiation since it is a high-atomic-number-element.

As a semiconductor material which constitutes the semiconductor layer 30 of the flexible semiconductor device 100, any suitable materials may be used. For example, the semiconductor layer may be made of silicon (e.g., Si), germanium (Ge) and the like. The semiconductor layer may also be made of an oxide. The oxide of the oxide semiconductor may be an oxide of an elementary substance such as ZnO, $SnO_2$, $In_2O_3$ and/or $TiO_2$, or a composite oxide such as InGaZnO, InSnO, InZnO and/or ZnMgO. As needed, a compound semiconductor may also be used, in which case a compound thereof is for example GaN, SiC, ZnSe, CdS and/or GaAs and so forth. Furthermore, an organic semiconductor may also be used, in which case an organic thereof is for example pentacene, poly-3-hexyl-thiophene, porphyrin derivatives, copper phthalocyanine and/or C60 and so forth.

It is preferred that the flexible semiconductor device 100 of the present invention comprises the semiconductor structure portion which has been subjected to an annealing treatment. Specifically, it is preferred that, as a result of the heat treatment of the semiconductor layer 30 induced by the laser irradiation, a film quality of the semiconductor structure portion has been modified as compared with that before the laser irradiation. As an example, a component of the semiconductor layer may be modified from an amorphous silicon (before the irradiation) to a polycrystalline silicon (after the irradiation). Such polycrystalline silicon has its average particle diameter of a few hundred nm to about 2 micrometers, for example. In a case where the semiconductor layer 30 consists of polycrystalline silicon at the point in time before the laser irradiation, the degree of the crystallization thereof can be improved by the irradiation. Moreover, the modification of the film quality of the semiconductor structure portion can improve a mobility of the semiconductor layer 30. This means that there may be a significant difference in the mobility of the semiconductor layer 30 between the before-irradiation and the after-irradiation.

As will be appreciated from the foregoing, the term "film quality" used in the present description substantially means the properties such as "crystalline condition", "degree of crystallization" and/or "mobility" of the semiconductor layer. In other words, the modification of the film quality substantially means that "crystalline condition", "degree of crystallization" and/or "mobility" change(s) or improve(s) as far as the semiconductor layer is concerned.

Even in a case where the oxide semiconductor is used instead of the silicon semiconductor, the semiconductor properties can also be improved. For example in a case of the crystalline oxide semiconductor such as ZnO, there are relatively large amount of amorphous state in the crystalline layer immediately after being formed as a film by a sputtering and the like, and thereby frequently failing to show the properties of the semiconductor (i.e., performance of the semiconductor device). However, the performing of the annealing treatment makes it possible to improve the crystallinity of the oxide semiconductors (e.g., ZnO), which leads to an improved performance of the semiconductor.

As an example regarding the above, when ZnO is formed by a RF magnetron sputtering process in the order of the formations of ZnO film (50 nm) and $SiO_2$ film (50 nm), the formed layer only shows as low mobility as 1 $cm^2$/Vs or lower at the point in time before the excimer laser irradiation. While on the other hand, after the excimer laser irradiation, the layer becomes capable of functioning as the semiconductor and thus it can have a mobility of about 20 $cm^2$/Vs.

Also as for the amorphous oxide semiconductor such as InGaZnO, the effects of improving the semiconductor properties can be provided. In the case of the amorphous oxide semiconductor, an oxygen deficiency can be restored and thus the mobility can be improved due to the laser irradiation under the oxygen atmosphere (for example, air atmosphere). In a case where an oxide film (e.g., $SiO_2$ or $Al_2O_2$ film) is provided as the gate insulating layer 20, the oxygen deficiency of the amorphous oxide semiconductor can be restored due to an oxygen supplied thereto through the insulating layer 20 from the openings 50a,50b. When the TFT is produced using InGaZnO as the semiconductor material, the very low mobility (i.e., about 1 $cm^2$/Vs or lower) before the laser irradiation can be increased to the degree of about 10 $cm^2$/Vs after the laser irradiation.

In the flexible semiconductor device 100 of the present invention, the semiconductor structure portion is supported by the metal layer 10. For example, the metal layer 10 may consist of a metal foil. It is preferred that the metal which constitutes the metal foil 10 is a metal with an electric conductivity and a relatively high melting point. For example, copper (Cu, melting point: 1083° C.), nickel (Ni, melting point: 1453° C.), aluminum (Al, melting point: 660° C.) and/or stainless steel (SUS) may be used. On the metal foil 10, there is formed the insulating film 20. More particularly, the insulating film 20 made of an inorganic insulating material (e.g., silicon oxide or silicon nitride) is formed on a part of the surface (top face) of the metal foil 10, for example. On the insulating film 20, there is formed the semiconductor layer 30.

The insulating layer 20 may be formed by oxidizing the surface of the metal layer 10 (e.g., metal foil). It is preferred in this case that a metal foil made of a valve metal (for example, an aluminum foil) is used as the metal layer 10. An anodic oxide film can be formed on the surface of the metal foil by anodizing the valve metal thereof by using a chemical conversion solution, and thus this anodic oxide film may be used as the insulating layer 20. This "anodic oxide film" is a very thin and densified oxide film, providing such an advantageous effect that the insulating layer 20 has no defect or the reduced degree of the defect.

The material for the insulating layer 20 is not limited to the above, but any suitable materials may be used depending on the property required for the gate insulating film. For example, silicon oxide or silicon nitride may be used. As the material of the insulating layer 20, not only the inorganic insulating material but also the other insulating materials such as organic insulating materials (e.g., polyimide) may be used.

In the illustrated embodiment of Figures, the gate electrode 10g and wirings 10a,10b are formed by the metal foil 10 serving as the support layer. Specifically, the opening (e.g., opening 10') is formed in the metal layer 10 for example by patterning the metal layer 10, whereas the parts serving the gate electrode 10g and wirings 10a,10b are provided in the metal layer 10.

In the flexible semiconductor device 100 of the present invention, the source and drain electrodes 40s,40d are in contact with the semiconductor layer 30. In the semiconductor layer 30, a region located between the source electrode 40s and the drain electrode 40d functions as a channel region. Examples of the material to be used as the source and drain electrodes 40s,40d include a metallic material such as gold (Au), silver (Ag), copper (Cu), nickel (Ni), chromium (Cr), cobalt (Co), magnesium (Mg), calcium (Ca), platinum (Pt), molybdenum (Mo), iron (Fe), zinc (Zn), titanium (Ti) and/or tungsten (W) and the like; an electrically-conductive oxide such as tin oxide ($SnO_2$), indium tin oxide (ITO), fluorine-containing tin oxide (PTO), ruthenium oxide ($RuO_2$), iridium oxide ($IrO_2$) and/or platinum oxide ($PtO_2$) and the like. For example, Ag paste may be used to form the source and drain electrodes 40s,40d. The source and drain electrodes 40s,40d using such paste material may be formed by the printing technique (e.g., ink jet printing process).

At a part of the insulating layer 20 provided on the metal layer 10, there may be formed a via opening 20c in which an interlaminar connecting portion (via) 60c may be provided. For example, the interlaminar connecting portion (via) 60c may be provided through a filling of an electrically material (e.g., Ag paste) into the via openings 20c.

In the illustrated embodiment of Figures, the wiring 10a is in connection with the drain electrode 40d provided on the insulating layer 20 through the interlaminar connecting portion (via) 60c. Alternatively, a part of the drain electrode 40d may extend to the via opening 20c, and thereby the interlaminar connecting portion (via) 60c is provided.

In the flexible semiconductor device 100 of the present invention, the gate electrode 10g is provided below the channel region of the semiconductor layer 30 through the intervention of the gate insulating film 20a. It is desired that the gate electrode and the channel region have the same size as each other, and they are positioned in an overlapping relation with each other with no misalignment. The reason for this will be described with reference to FIG. 3. Supposing a case where the gate electrode 10g and the channel 30a are in misalignment with each other and another case where the gate electrode 10g is smaller than the channel 30a (see FIG. 3(a)), there is no portion of the gate electrode 10g below the channel region 30a in any of these cases. In these cases, even when the voltage is applied to the gate electrode 10g, an electrical charge is not induced at the no portion of the gate electrode. The channel portion 30a with no induced charge can only exhibit a low conductivity, and thereby the channel cannot fully function, which leads to a low electrical current extracted from the drain electrode. Thus, it is preferred that the whole of the channel region is covered with the gate electrode.

While on the other hand, in a case where the gate electrode 10g and the channel 30a are in misalignment with each other and another case where the gate electrode 10g is larger than the channel 30a (see FIG. 3(b)), there is an overlapping portion of the gate electrode 10g with respect to the source electrode 40s and/or the drain electrode 40d. In these cases, the parasitic capacitance of the transistor can be generated at the overlapping portion between the gate electrode 10g and the source electrode 40s, which can impair the transistor performance. Namely, the parasitic capacitance can lead to such undesired problems that a waveform of the output signal can become not sharp, or the amount of the required current can be increased and thereby causing the power consumption to be increased. The same is true on the relationship between the gate electrode 10g and drain electrode 40d. Accordingly, it is desired that there is smaller overlapping between the gate electrode 40g and the source electrode 40s.

It is therefore concluded that the gate electrode 10g and the channel region 30a have the same size as each other and they are positioned in an overlapping relation with each other with no misalignment (see FIG. 3(c)).

<<Manufacturing Method of Flexible Semiconductor Device>>

Next, with reference to FIGS. 4 to 7, the manufacturing method of the flexible semiconductor device 100 according to the present invention will be explained. FIGS. 4(a) to 4(e), FIGS. 5(a) to 5(d), FIGS. 6(a) to 6(c) and FIGS. 7(a) and 7(b) respectively show cross-sectional views illustrating the steps in a manufacturing process of the flexible semiconductor device 100.

Upon carrying out the manufacturing method of the present invention, the step (i) is firstly performed. That is, an insulating layer is formed on one of principal surfaces of a metal foil. Specifically, as shown in FIG. 4(a), a metal foil 10 which serves as a support layer is firstly provided. For example, a copper foil is provided. As the metal foil 10, any of commercially available ones can be used. The metal foil 10 has a thickness preferably in the range of about 3 μm to about 100 μm, more preferably in the range of about 4 μm to about 20 μm, still more preferably in the range of about 8 μm to about 16 μm. Subsequent to the provision of the metal foil, an insulating layer 20 is formed on a surface of the metal foil 10 as shown in FIG. 4(b). The insulating layer 20 may be provided by the "anodic oxidation of valve metal" as mentioned above (especially in a case where the metal foil is made of a valve metal). However, it is possible to form the insulating layer 20 by performing other methods. For example, it can be formed by a sol gel process. With respect to the sol gel process, the insulating layer 20 can be formed by applying (for example, spin-coating) an organic-inorganic hybrid material wherein organic molecules are bonded to the siloxane backbone, followed by calcinating it at about 300° C. to about 600° C. The thickness of the insulating layer 20 is approximately in the range of 0.1 μm to about 1 μm, for example.

As shown in FIG. 4(c), it is preferred that a via portion 60c serving as an interlaminar connecting portion is formed in the insulating layer 20. In this regard, an opening 20c may be formed at a formed region of the via 60c, followed by filling an electrically-conductive material into the opening 20c. A typical photolithography process may be performed for the formation of the opening 20c. The etching of the insulating layer performed may be for example a dry etching using $CF_3$.

Subsequent to the step (i), the step (ii) is performed. That is, a semiconductor layer is formed on the insulating layer, and then source and drain electrodes are formed such that the source and drain electrodes contact with the semiconductor layer. Specifically, the semiconductor layer 30 is firstly formed on the insulating layer 20 as shown in FIG. 4(c). For example, the thickness of the semiconductor layer 30 may be approximately in the range of about 5 nm to about 990 nm (the thickness of the semiconductor structure portion may be for example approximately in the range of about 10 nm to about 1 μm). The formation of the semiconductor layer 30 can be performed for example by a thin film formation process such as a vacuum deposition process, a sputtering process and a plasma CVD process, as well as by a printing process such as a relief printing process, a gravure printing process, a screen printing process and an ink jet printing process. For example in a case where the semiconductor layer 30 is a silicon layer, an amorphous silicon-containing semiconductor layer 30 can be formed by applying a cyclic silane compound-containing solution (for example, cyclopentasilane-containing toluene solution) to the predetermined position on the insulating layer 20 with the ink jet printing process, followed by subjecting it to a heat treatment at about 300° C.

Subsequent to the formation of the semiconductor layer 30, the source and drain electrodes 40s,40d are formed on the insulating layer 20 such that the source and drain electrodes 40s,40d contact with the semiconductor layer 30 as shown in FIG. 4(d). In particular, the drain electrode 40d is disposed such that it extends to the position of the via portion 60c. Specifically, the drain electrode 40d is formed such that one end of the drain electrode 40d contacts with the via portion 60c and the other end of the drain electrode 40d contacts with the semiconductor layer 30.

Each of the source and drain electrodes has the thickness of about 50 nm to about 5 μm, for example. The formation of the source and drain electrodes 40s,40d can be performed through an application of Ag paste by using of a printing process (e.g., a screen printing process, a gravure printing process, or an ink jet printing process). When a part of the drain electrode 40d is disposed within the opening 20c upon the formation of the drain electrode 40d, the formation of the drain electrode and the formation of the via 60c can be concurrently performed with each other.

When the source electrode is required to be in contact with the wiring made of the metal foil, the matter regarding the formation of the drain electrode can be similarly applied to that of the source electrode.

Subsequent to the step (ii), the step (iii) is performed. That is, as shown in FIG. 4(e), a flexible film layer 50 is formed so that the flexible film layer covers the semiconductor layer 30 and the source and drain electrodes 40,40d. Specifically, a resin film in a semi-cured condition is prepared wherein an adhesive material may be applied to the laminating surface of the resin film, and thereafter the prepared resin film is laminated onto the metal layer on which the semiconductor structure portion is provided. The laminate thus formed is then subject to a tentative bonding. The condition for the tentative bonding can be selected depending on the kinds of the semi-cured resin film and the adhesive material. For example, in a case of the resin film composed of a polyimide film (thickness: about 12.5 μm) and an epoxy resin (thickness: about 10 μm) as the adhesive material applied to the laminating surface thereof, the resin film and the metal foil are laminated onto each other and the resulting laminate is subject to a tentative pressure bonding under the heating condition of about 60° C. and the pressure condition of about 3 MPa.

The thickness of the formed resin film 50 is for example in the range of about 4 μm to about 100 μm. The formation of the resin film 50 makes it possible to protect the semiconductor structure portion and also to safely perform a handling or conveying procedure in the subsequent steps such as the patterning treatment of the metal foil 10 and the like.

Subsequent to the step (iii), the step (iv) is performed. That is, vias are formed in the flexible film layer, and thereby a semiconductor device precursor is provided. For example, as shown in FIGS. 5(a) and 5(b), openings 50a,50b are formed in the flexible film layer 50, and thereafter an electrically-conductive material is supplied into the resulting openings to form the vias 60a,60b. The completion of the formation of the vias 60a,60b produces the semiconductor device precursor 100'.

The openings 50a,50b of the resin film layer can be formed by a laser processing. As a laser for the laser processing, a carbon dioxide laser, a YAG laser, an excimer laser or the like may be used. As for the laser condition, the energy density may be in the range of about 50 mJ/cm$^2$ to about 500 mJ/cm$^2$, for example.

The opening 50a used for the contact via can be formed by irradiating the resin film layer 50 with a laser so that a surface of a circuit electrode which is connected to the semiconductor structure portion is exposed. While on the other hand, the opening 50b used for the alignment marker can be formed by irradiating the resin film layer with the laser so that the upper surface of the insulating film in a form of metal film is exposed. With regard to the laser irradiation, each size (diameter) of the openings 50a,50b can be controlled to a desired size by adjusting the diameter of the laser. In this respect, the opening size (diameter) formed by the laser irradiation may be in the range of about 5 μm to about 80 μm. For example, the diameter of the opening may be approximately 30 μm in its aperture plane. In the meanwhile, a desired beam diameter may be obtained not only by adjusting the diameter of the laser, but also by applying a mask to the laser beam.

Moreover, when the openings 50a,50b are formed by the laser processing, each of the openings can be formed in a tapered shape (namely, there can be formed so-called "earthenware mortar form" or "inverted conical form" of the opening). That is, it is capable of forming an angle between the wall surface of each of the openings 50a,50b and the top face of the resin film layer 50 to be an obtuse angle (i.e. larger than 90 degrees). For example, the taper angle "α" as shown in FIG. 5(*a*) can be in the range of about 110° to about 160°. Comparing with the case where the angle between the wall surface of each of the openings 50a,50b and the top face of the resin film layer 50 is the right angle (=90 degrees) (in this regard, the angle may generally become "about 90 degrees" if the opening is formed by the machining process such as drilling and the like), each of the tapered openings 50a,50b enables it to facilitate the filling process of the openings 50a,50b with the use of the electroconductive material.

When the energy density of about 2 J/cm$^2$ to about 5 J/cm$^2$ is used upon the formation of the opening, the insulating layer made of the inorganic material (for example silica, i.e., $SiO_2$) can be additionally subjected to the laser processing. The formed opening can extend not only in the resin film 50, but also in the insulating layer 20. Namely, the formed opening can extend to reach the lower metal layer which corresponds to the lower face of the semiconductor structure portion. In this case, the alignment marker can be visible from below by means of visible light when the removal of the lower metal is performed. This is particularly preferable in a case where a functional layer is laminated onto the lower face of the flexible semiconductor device of the present invention.

The method for forming the openings 50a,50b is not limited to the laser processing. For example, a punching process or mechanical drilling process may also be adopted for the formation of the openings. Furthermore, a photolithography process may also be adopted to form the openings in a case where the film is made of a light-sensitive polymer or the like.

For forming each of the vias 60a,60b, an electrically-conductive part is formed within each of the openings 50a,50b. In a case where the electrically-conductive part is made from an electrically-conductive paste, such electrically-conductive paste may be supplied into the openings 50a,50b by a printing process for the purpose of forming the electrically-conductive part. More specifically, a print mask is disposed on a surface of the resin film 50, and thereafter the openings 50a,50b are filled with the electrically-conductive paste by means of a squeegee. The print mask is used for preventing a contamination of the surface of the resin film with the electrically-conductive paste, and thus the print mask is provided with holes formed therein, the holes corresponding to the openings of the resin film. As an example of the print mask, a screen plate may be used. Alternatively, a PET film mask obtained by the PET film preliminarily laminated onto the surface of the resin film may also be used. In this regard, the PET film is laminated onto the surface of the resin film, and thereafter the laser irradiation is performed with respect to the PET film. As a result, there can be obtained the PET film mask wherein the holes of the PET film and the openings of the resin film are in alignment with each other. The PET film mask in itself is finally removed after the filling of the electrically-conductive paste is completed.

As shown in FIG. 5(*c*), it is preferred that a metal foil 15 is disposed on the resin film 50, and then a thermocompression bonding therebetween is performed (namely, a further metal layer 15 is preferably formed on the semiconductor device precursor 100'). The condition of the thermocompression bonding may be suitably selected depending on the kinds of the semi-cured resin film and the adhesive material. For example in a case of the resin film composed of a polyimide film (thickness: about 12.5 μm) and an epoxy resin (thickness: about 10 μm) as the adhesive material applied to the laminating surface thereof, the metal foil 15 may be laminated onto the resin film 50 and thereafter the adhesive material may be subject to a substantial curing for about 1 hour under the condition of about 140° C. and about 5 MPa. In a case where the electrically-conductive part comprises Cu component, the metal layer 15 can be formed by a plating process, which is preferable in terms of the productivity since the thermocompression bonding of the laminated metal foil can be eliminated. In this regard, a Cu seed layer is firstly formed by performing an electroless copper plating, and subsequently the opening is filled with Cu material by performing an electrolytic copper plating. Just as an example, the electroless copper plating can be performed by immersing a sample into an electroless plating bath obtained by adding a formaldehyde as a reducing agent into a copper sulfate aqueous solution. The electrolytic plating can be performed by immersing the sample in a copper sulfate aqueous solution so that the sample is used as a cathode and the phosphorus-containing copper is used as an anode. A polyether compound, an organic sulfur compound and/or an amine compound can be added to the copper sulfate aqueous solution, and plating can be performed by applying an electric current of about 3 A/dm$^2$ (a resist layer may also be formed on the upper surface of the resin film such that holes of the resist layer is in alignment with the openings 50b of the resin film).

Subsequent to the step (iv), the step (v) is performed. That is, the metal foil 10 is subjected to a processing treatment, and thereby forming a gate electrode 10g from the metal foil 10. It is preferred that wirings 10a,10b are also formed from the metal foil 10 upon the formation of the gate electrode 10g from the metal foil 10.

In the step (v), a photo-resist film 11 is firstly formed on the metal foil at a position for the gate electrode and/or wiring to be formed. Specifically, as shown in FIG. 5(*d*), the photo-resist film 11 is formed on the approximate whole of the lower surface of the metal foil 10. Subsequently, as shown in FIG. 6(*a*), a photomask 12 is disposed underneath the photo-resist film 11. Subsequently, as shown in FIG. 6(b), the photo-resist film 11 is subjected to a light-exposure treatment through the photomask 12, and thereafter the developing treatment is performed to remove the unnecessary portions of the photo-resist film. The disposition of the photomask 12 is performed by superimposing the alignment marker 60b of the resin film and a corresponding pattern of the photomask 12 onto each other (see FIGS. 6(a) and 6(b)). The identification of the alignment marker of the resin film can be done for example by using a X-ray transmission image obtained by irradiating the semiconductor device precursor 100' with a X-ray wherein the X-ray irradiation is performed above the semiconductor device precursor 100' and thus the X-ray transmission image is obtained underneath the metal foil 10. In general, a lighter element (i.e., an element with a lower atomic number) makes it possible for the X-ray to well penetrate therethrough, while on the other hand a heavier element (i.e., an element with a higher atomic number) such as a metal makes it hard for the X-ray to penetrate therethrough. Therefore, when the X-ray having a sufficient intensity for penetrating the metal foil is used in the X-ray irradiation, there can be generated a distinct contrast between the metal conductive part (i.e., position of alignment marker) and the body of the resin film part, and thereby the alignment marker can be well identified.

After the light-exposure and developing treatments, the metal foil 10 with the partially removed photo-resist film 11' disposed thereon is subjected to an etching process, and thereby forming the gate electrode 10g and wirings 10a,10b from the metal foil 10 (FIGS. 6(c) and 7(a)). The method of the etching can be suitably selected depending on the kind of the metal foil. For example in a case where the metal foil is a copper foil, the etching can be performed by immersing it into an aqueous solution of iron chloride. Alternatively, the etching can be performed by a dry etching process (e.g., RIE).

The partially removed photo-resist film 11' used upon the developing treatment can be formed by the use of a direct light-exposure (see FIG. 8), instead of the use of the photomask. As for the direct light-exposure, a desired position (pattern) of the photo-resist film is locally irradiated with the laser (e.g., laser with wavelength of 355 nm). That is, the photo-resist film is directly exposed to the light with no photomask disposed thereon. The position to be irradiated with the laser can be determined based on the identification of the alignment marker 60b. Such identification of the alignment marker 60b can be done similarly to that of the above use of the photomask. In other words, the direct light-exposure makes use of at least one of the vias of the semiconductor device precursor as an alignment marker in order to directly expose the desired position of the photo-resist film to the light without using the photomask.

In any of "light-exposure using photomask" and "direct light-exposure", it is preferred that a part of the metal foil is removed, the part being located above or under the alignment marker. The reason for this is that the alignment marker can be identified by using a visible light when a functional layer (e.g., image display layer) is aligned to be laminated onto both sides or one side of the semiconductor device. Such alignment using the visible light is simple and is preferable since it can prevent a cumulative risk of the misalignment only by using the same alignment marker as that of the semiconductor device.

It is also possible to similarly form the photo-resist on the metal foil 15 disposed on the upper surface of the resin film, and thereafter performing the etching process in order to form a desired wiring pattern 70, image electrode 150 or the like (see FIG. 7(b)). In the embodiment as illustrated in Figures, the lower metal foil disposed underneath the lower surface of the semiconductor structure portion and the upper metal foil disposed on the resin film are individually performed. It is accordingly preferred that one of the metal foils is protected during the etching of the other metal foil by covering the whole surface of the other metal foil with the photo-resist. The kind and thickness of the upper and lower metal foils can be selected as appropriate. In this regard, it is preferred that both of the upper and lower metal foils have the same material and the same thickness as each other (e.g., both of them are copper foils with their thickness of 12 μm) since the etching processes for the both of them can be performed at a time, making it possible to improve the productivity. Such concurrent etching process can be performed by immersing the upper and lower metal foils 10,15 with the patterned photo-resist films thereon into the etching solution in order to form the desired patterns of the metal foils 10,15.

Throughout the above-mentioned steps, there can be finally obtained the flexible semiconductor device 100 having the structure as shown in FIG. 7(b) and FIG. 1. As seen from the embodiment shown in Figures (especially FIG. 7(b)), the gate electrode 10g is made of a part of the metal layer 10, and also the gate insulating film 20a is made of a part of the insulating layer 20. In the flexible film layer 50, a plurality of vias (60a, 60b, 60c, . . . ) are provided such that they extend in a thickness direction of the layer 50. The partially removed portion of the metal layer is provided at a position of at least one via (i.e., via 60b in FIG. 7(b)). As for the embodiment shown in FIG. 7(b), a part of the metal foil, which part is in contact with the upper surface of the via 60b, has been removed, and also another part of the metal foil, which another part is in contact with the lower surface of the via 60b, has been also removed (the removed portions are indicated by the dashed lines). Moreover, unlike the contact via 60a and the interlaminar connecting via 60c, the via 60b serving as the alignment marker extends from one of the principal surfaces of the flexible film layer 50 to the other of the principal surfaces of the flexible film layer 50 as shown in FIG. 7(b).

In the manufacturing method of the present invention, the openings 50a,50b of the resin film layer 50 are filled with the electrically-conductive material (e.g., metal material) to form the electrically-conductive parts therefrom. Accordingly, the formation of the contact via and the formation of the alignment marker can be performed substantially by the same step at a time. The alignment marker in the present invention can be well identified by using the X-ray transmission image, making it possible to manufacture the TFT with no misalignment between the gate electrode and the channel. In other words, the present invention makes it possible to not only improve an efficiency of the manufacturing process but also improve the TFT performance by the alignment marker (i.e., the electrically-conductive part) provided in the resin film.

(Alignment Marker and Alignment)

Now, the characterizing feature of the present invention, i.e., "alignment" and "alignment marker" will be described in detail. It is preferred in the present invention that the X-ray transmission image obtained by using the alignment marker is used upon the alignment of the photomask. Specifically, as shown in FIG. 9, it is preferred that the X-ray transmission image 110 obtained by irradiating the semiconductor device precursor 100' with the X-ray is used, in which case via-corresponding points 120 in the X-ray transmission image are used as a positioning reference. Namely, the image points which correspond to the positions of the vias are used as the positioning reference, such image points being obtained by irradiating the semiconductor device precursor 100' having the alignment markers 60b,60b' with the X-ray.

The alignment markers may be provided per light-exposure region. For example, a set of the alignment markers (e.g. two alignment markers or two units of the alignment markers) may be provided per photomask. In other words, the following matters can be conceivable:

When the photomask is disposed per one transistor, the alignment markers are disposed per such one transistor (FIG. 10(a)).

When the photomask is disposed per one group of a plurality of transistors, the alignment markers are disposed per such one group (FIG. 10(b)).

When all the transistors in the work are subjected to the light-exposure and developing treatments by using one photomask, a set of the alignment markers are disposed per such work (FIG. 10(c)).

The position of the alignment marker is not particularly limited. Take an embodiment where the alignment of the photomask is performed upon the disposing thereof as an example, the alignment markers may be disposed at the central region of the short side of the rectangular photomask. This makes it possible to minimalize the misalignment between the photomask and the work (i.e., a superimposition accuracy can be improved). For example, the two alignment markers are measured by using the X-ray transmission image as described above, and thereby a centroid of the alignment region is determined, and also the assigned dimensions and error are corrected. As a result, the alignment of the photomask can be suitably performed by considering the values designed from the above centroid.

According to the present invention, the single via can serve as the alignment marker. However, the unit of a plurality of the vias can also serve as the alignment marker, as shown in FIGS. 11(a) to 11(d). That is, the four alignment markers may be disposed such that the unit (i.e., group) of them forms a square. Alternatively, the five alignment markers may be disposed such that the unit (i.e., group) of them forms a cross-like figure. As such, a plurality of the alignment markers may be disposed so that the unit (i.e., group) of them is in a desired form as a whole. This makes it possible to more clearly distinguish the alignment markers from the contact via, which leads to a desired image recognition.

Figure 13:
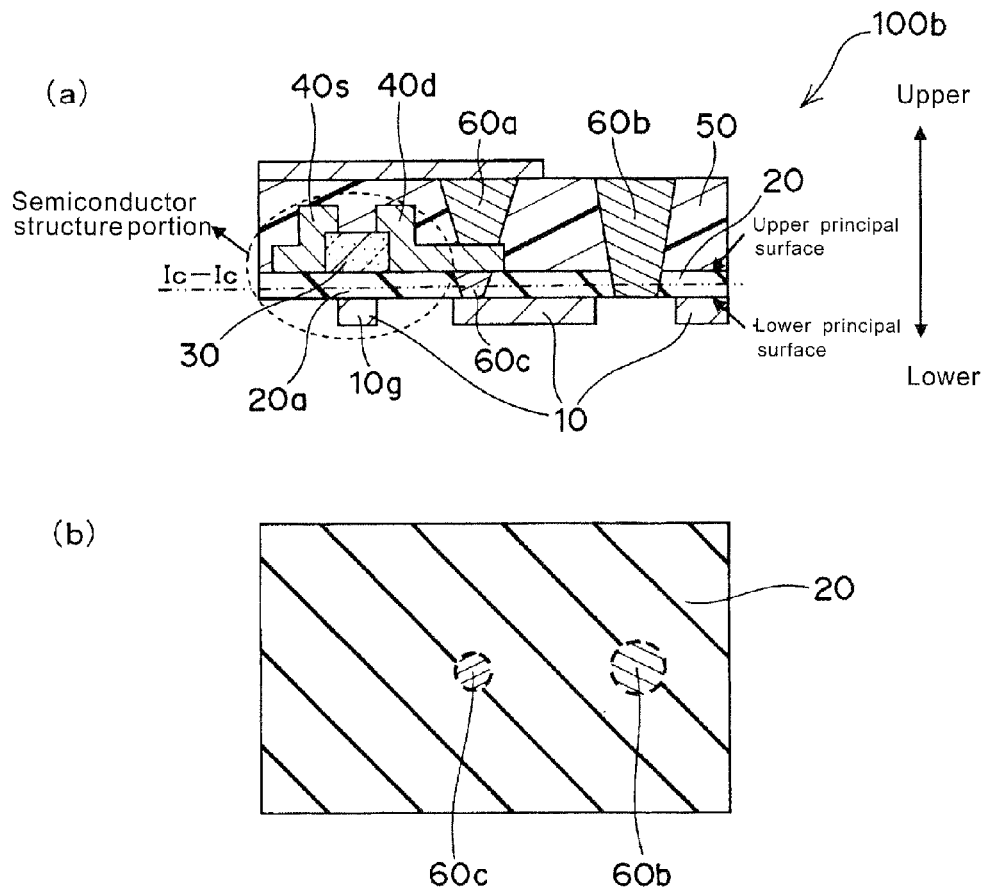
FIG. 13(a) is a cross sectional view schematically illustrating a flexible semiconductor device wherein the alignment marker extends to reach the lower principal surface of the insulating layer.
FIG. 13(b) is a plan view illustrating the flexible semiconductor device taken along a line Ic-Ic of FIG. 13(a).

Upon the alignment of the photomask, not the X-ray, but a visible light ray may be used. Specifically, as shown in FIG. 12, the alignment marker 60b is formed such that it extends to the lower surface of the insulating layer 20 (see FIG. 12(a)), and thereafter the metal layer 10 and the photo-resist film are partially removed at a lower position of the alignment markers 60b (see FIG. 12(b)). As a result, the position of the alignment marker 60b can be identified when illuminating the lower side of the device precursor by means of the visible light (see FIG. 12(c)). Accordingly, by making use of the markers 60b as a positioning reference, the alignment of the photomask and the alignment of the direct light-exposure can be suitably performed. In the case of an embodiment using the visible light, the finally obtained flexible semiconductor device 100b can have a structure as shown in FIG. 13. Namely, as shown in FIG. 13, the alignment marker 60b of the flexible semiconductor device 100b extends to the lower principal surface of the insulating layer 20 beyond the upper principal surface of the insulating layer 20.

<<Image Display Device>>

Next, an embodiment wherein the flexible semiconductor device 100 of the present invention is utilized in an image display device will be described.

(2Tr1C)

Figure 14:
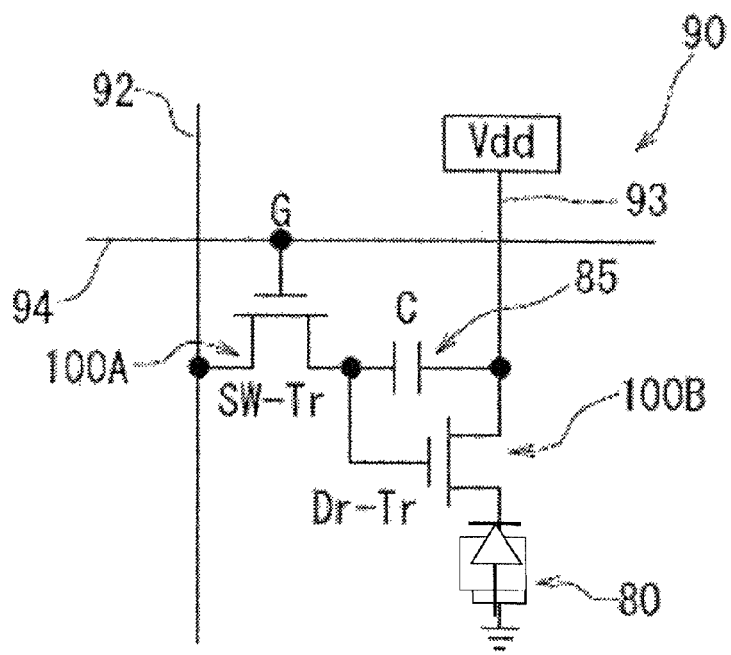
FIG. 14 is a circuit diagram showing a drive circuit of an image display device according to an embodiment of the present invention.
Figure 15:
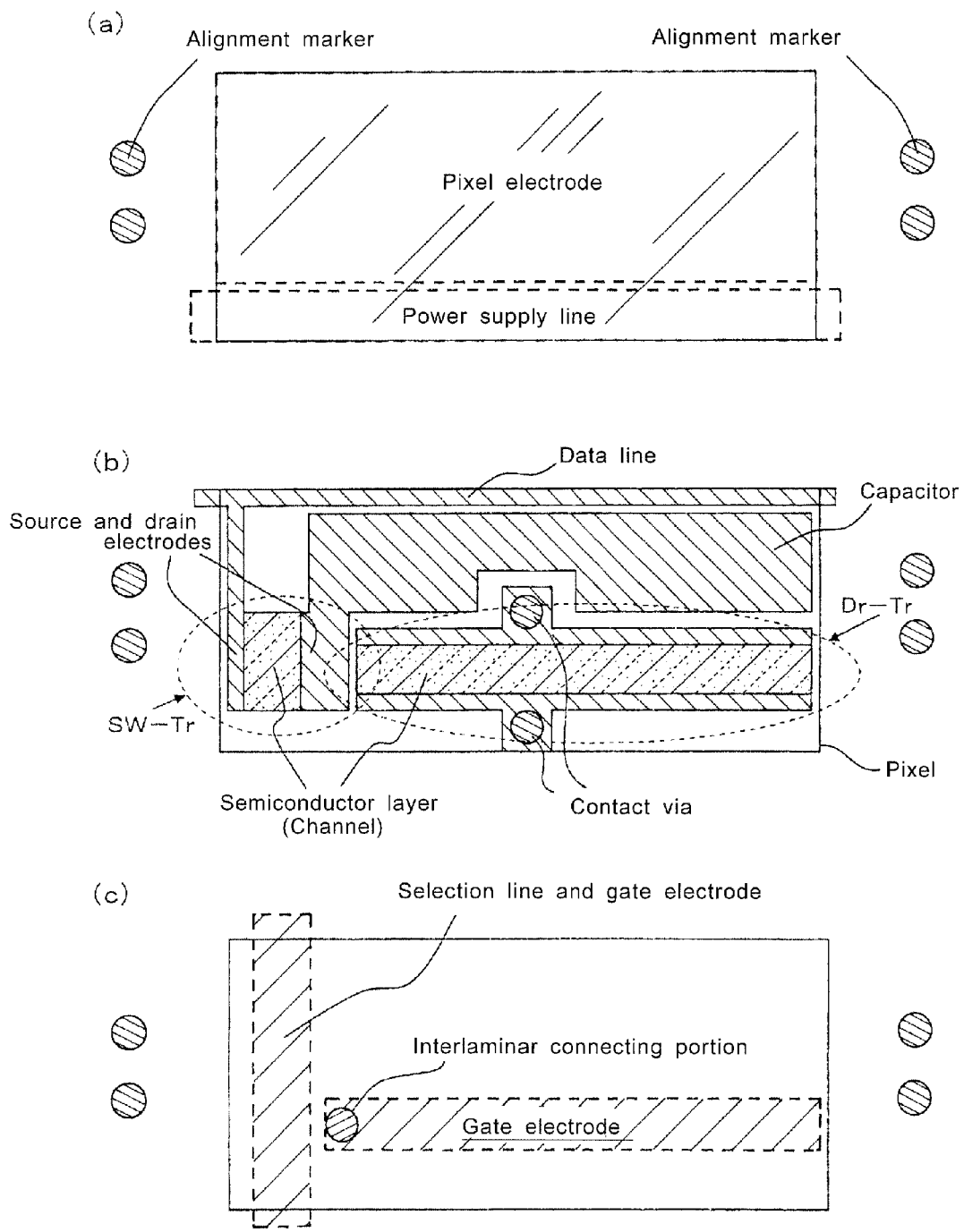
FIG. 15 is a plan view illustrating an exampled embodiment wherein the drive circuit of FIG. 14 is constructed by a flexible semiconductor device.

FIG. 14 is a circuit diagram for explaining a drive circuit 90 of the image display device. FIG. 15 is a plan view of an example wherein the drive circuit is constructed by using the flexible semiconductor device 100 according to an embodiment of the present invention.

The circuit 90 shown in FIG. 14 is a driving circuit which is mounted on an image display device (e.g., organic electroluminescence display), and FIG. 14 shows a constitution of one pixel in the image display device. Each pixel in the image display device according to the present invention comprises a circuit with a combination of two transistors (100A, 100B) and one capacitor 85. This driving circuit includes a switching transistor 100A (hereinafter, referred to as "Sw-Tr") and a driving transistor 100B (hereinafter, referred to as "Dr-Tr"), both of which consist of the flexible semiconductor device 100 of the present invention. It is possible that the structure of the flexible semiconductor device 100 is provided with a capacitor. More specifically, a gate electrode of Sw-Tr 100A is connected to a selection line 94. As for the source electrode and the drain electrode of Sw-Tr 100A, one thereof is connected to a data line 92 and the other thereof is connected to a gate electrode of Dr-Tr 100B. As for the source electrode and the drain electrode of Dr-Tr 100B, one thereof is connected to a power line 93 and the other thereof is connected to a display area 80 (e.g., an organic electroluminescence element). The capacitor 85 is connected to the region between the source electrode and the gate electrode of Dr-Tr 100B.

As for the above pixel circuit, when the switch of Sw-Tr 100A is set "ON" during the activation of the selection line 94, a driving voltage is supplied from data line 92 and then selected by Sw-Tr 100A, and thereby a voltage is applied to the gate electrode of Dr-Tr 100B. The drain current corresponding to the voltage is supplied to the display 80, thereby the display (organic EL device) 80 is caused to emit light. When the voltage is applied to the gate electrode of Dr-Tr 100B, electric charge is stored in the capacitor 85. This charge plays the role (retention volume) which continues the applying of the voltage to the gate electrode of Dr-Tr 100B over fixed time, even after the selection by Sw-Tr 100A is canceled.

FIG. 15 is a plan view of the flexible semiconductor device in which a part of the circuit 90 shown in FIG. 14 is formed. FIG. 15(a) is a plan view seen from the upper surface of the resin film. FIG. 15(b) is a plan view wherein the metal layer and the resin film disposed on the resin film have been eliminated. FIG. 15(c) is a plan view wherein the semiconductor structure portion and the electrically-conductive part as well as the insulating layer disposed on the metal foil have been further eliminated.

As shown in the circuit 90 in FIG. 14, the capacitor 85 which stores capacity is required in the drive circuit capable of driving an image display device. In the construction shown in FIG. 15, the capacitor is built in a part of the substrate structure, thus it is not necessary to arrange a capacitor separately to the exterior of the substrate structure. Therefore, it is possible to provide an image display device having a small size and high density mounting efficiency.

(Lamination of Image Display Device)

Next, an embodiment where the image display unit is produced by the transistor or a circuit comprising the transistors (particularly, an embodiment about the image display unit composed of a plurality of pixels over the flexible semiconductor device) will be explained.

Figure 16:
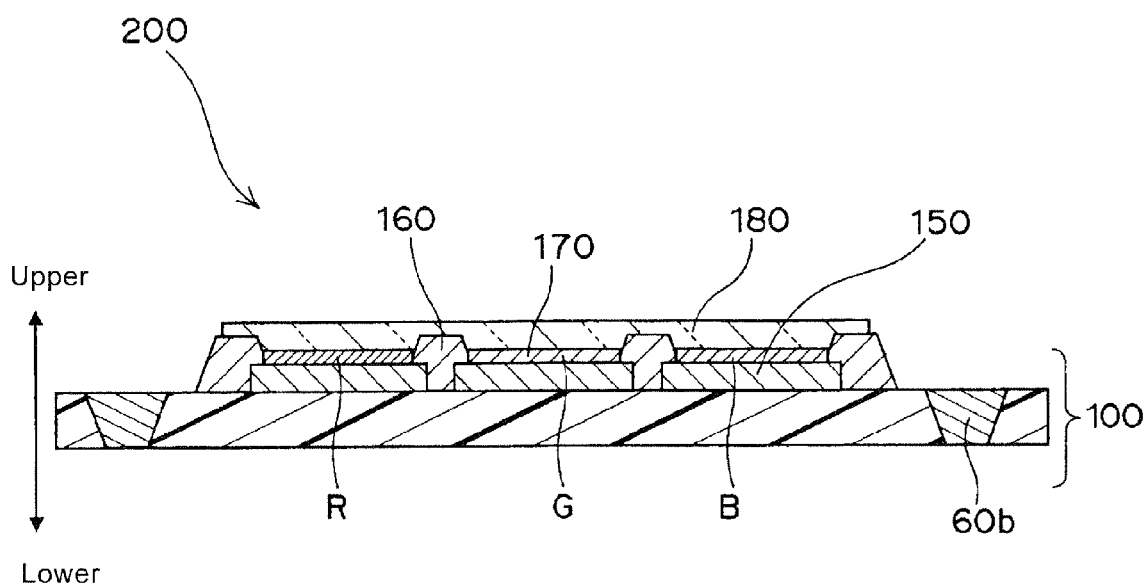
FIG. 16 is a cross sectional view schematically illustrating an image display device according to an embodiment of the present invention.

FIG. 16 is a sectional view of an OLED (organic electroluminescence) image display device 200 wherein three colors consisting of R (red), G (green) and B (blue) are used in three pixels on the flexible semiconductor device of the present invention. The semiconductor device is illustrated only by a resin film, pixel electrodes (cathodes) and the alignment markers. In such image display device 200, each light emitting layer 170 is arranged on each pixel electrode 150 consisting of R, G and B pixels where the luminescent materials of the light emitting layers respectively correspond to the respective ones of R, G and B. Pixel regulating parts 160 are provided between the adjacent pixels to prevent the adjacent luminescent materials from being intermingled with each other as well as to facilitate the positioning upon the supply of the EL materials. A transparent electrode layer (anode layer) 180 is provided over the light emitting layer 170 such that it covers the whole of each pixel.

Examples of the materials to be used for the pixel electrodes 150 include a metal (e.g., Cu). The pixel electrode may have a stacked layer structure composed of a charge injection layer and a surface layer (e.g., Al surface layer with its thickness of 0.1 μm) wherein the charge injection layer functions to improve a charge injection efficiency with respect to the light emitting layer 170, and the surface layer functions to improve a light extraction efficiency in upward direction by reflecting a light emitted from the light emitting layer. In this regard, the pixel electrode may be a reflection electrode with Al/Cu stacked layer structure, for example.

Examples of the material to be used for the light emitting layer 170 include, but not limited to, a polyfluorene-based electroluminescent material and a dendrimer-based light emitting material having a dendritically branched structure wherein at least one heavy metal (e.g., Ir or Pt) is positioned at the center of a dendron backbone of a so-called dendrimer. The light emitting layer 170 may have a single layer structure. Alternatively, the light emitting layer 170 may have a stacked layer structure with an electron injection layer/a light emitting layer/a hole injection layer wherein $MoO_3$ is used for the hole injection layer (to facilitate the injection of charge) and LiF is used for the electron injection layer. As the transparent electrode 180 of the anode, ITO may be used.

As for the pixel regulating part 160, it may be made of an insulating material. For example, a photosensitive resin mainly comprising polyimide, or SiN can be used as the insulating material of the pixel regulating part 160.

Figure 17:
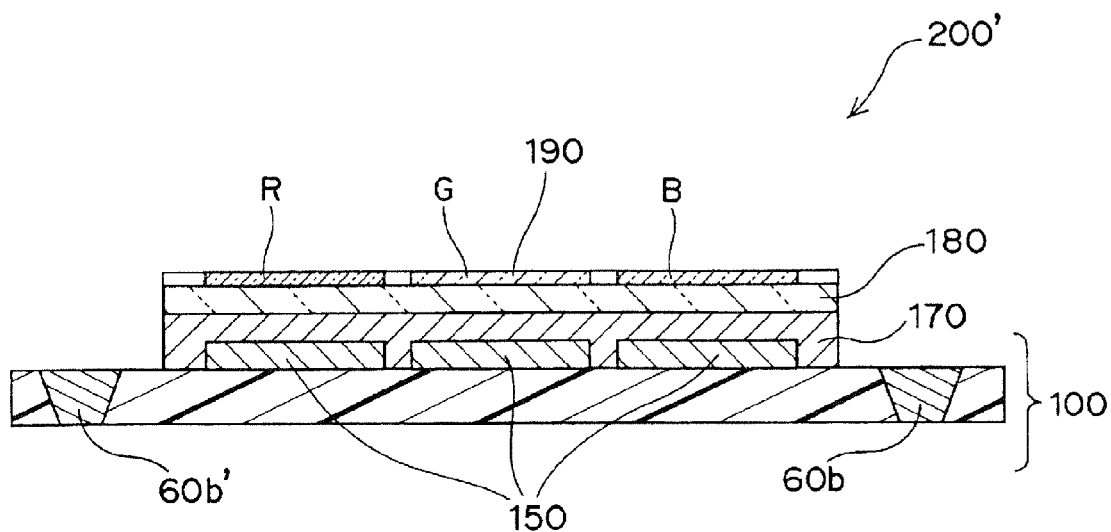
FIG. 17 is a cross sectional view schematically illustrating an image display device equipped with a color filter.

The image display device may be configured to have a structure with a color filter as shown in FIG. 17. The image display device 200' as shown in FIG. 17 comprises the flexible semiconductor device 100, a plurality of pixel electrodes 150 provided on the flexible semiconductor device 100, a light emitting layer 170 provided such that it wholly covers the pixel electrodes 150, a transparent electrode layer 180 provided on the light emitting layer 170, and a color filter 190 provided on the transparent electrode layer 180. In the image display device 200', the color filter 190 has a function to convert lights emitted from the light emitting layer 170 to three kinds of lights of red, green and blue, and thereby three kinds of pixels consisting of R (red), G (green) and B (blue) are provided. As for the image display device 200 shown in FIG. 16, each of the light emitting layers separated by the pixel regulating parts 160 emits each of red, green and blue lights separately. While on the other hand, as for the image display device 200' shown in FIG. 17, the light emitted from the light emitting layer has no difference in color (i.e., the light emitting layer emits white light), but the passing of the light through the color filter 190 causes the generation of each of red, green and blue lights.

(Manufacturing Method of Image Display Device)

Figure 18:
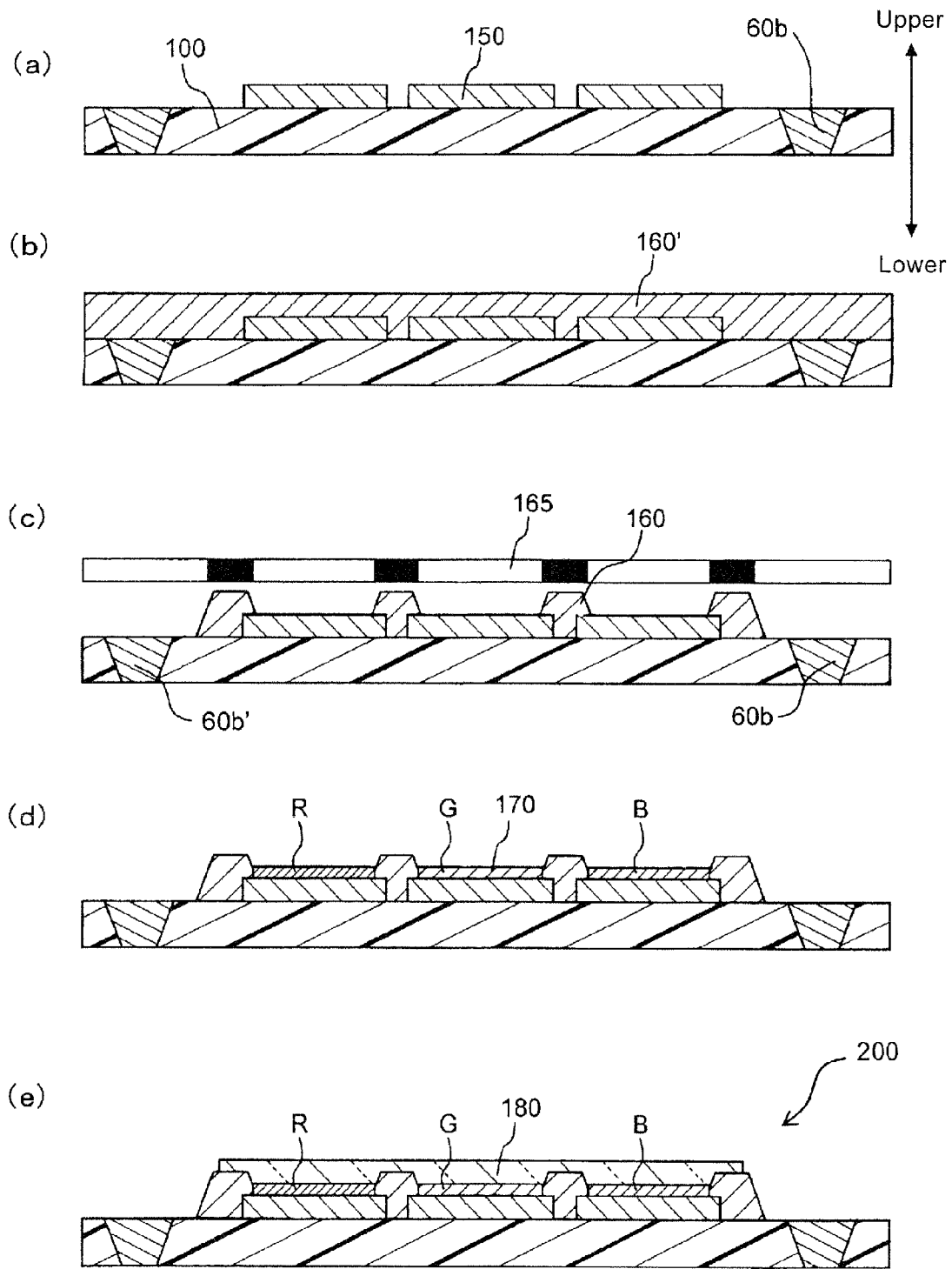
FIGS. 18(a) to 18(e) are cross sectional views schematically illustrating the steps in a manufacturing process of an image display device according to the present invention.

Next, a manufacturing method of the image display device will be explained. Specifically, a manufacturing method of OLED according to the present embodiment will be explained with reference to FIG. 18.

First, the step (I) is performed. That is, the flexible semiconductor device 100 equipped with pixel electrodes 150 is prepared as shown in FIG. 18(a). Specifically, the pixel electrodes 150 can be provided by subjecting the metal foil 15 to a patterning treatment (that is, the pixel electrodes 150 can be formed by etching away the part of the metal foil provided on the flexible film layer by the photolithography process or the like) upon the manufacturing process of the flexible semiconductor device 100. Alternatively, the pixel electrodes 150 can be provided by applying the raw materials for the pixel electrodes by a printing process or the like at predetermined portions upon the manufacturing process of the flexible semiconductor device 100.

Subsequently, the step (II) is performed. That is, an image display unit composed of a plurality of pixels is formed over the flexible semiconductor device. For example, as shown in FIGS. 18(b) to 18(d), a plurality of pixel regulating parts 160 are formed on the flexible semiconductor device 100, and then each light emitting layer 170 is formed on a region of each pixel electrode 150, the region being partitioned by the pixel regulating parts 160. The pixel regulating parts 160 can be formed, for example, by forming a precursor layer 160' for the pixel regulating parts wherein the pixel electrodes as a whole are covered with a photosensitive resin material mainly consisting of polyimide, followed by subjecting the precursor layer 160' to a photolithography process. Light emitting layers 170 of the predetermined colors are respectively formed on the corresponding ones of the pixel electrodes. The light emitting layers 170 can be formed, for example, by applying a solution of a polyfluorene-based electroluminescent material (1%) dissolved into xylene onto the pixel electrodes by performing an ink jet process. The light emitting layer 170 may have a thickness of about 80 nm, for example. Upon the photolithography process of the precursor layer 160' of the pixel regulating parts and/or upon the ink jet application of the light emitting material for the formation of the light emitting layer 170, the alignment markers 60b,60b' of the flexible semiconductor device are preferably used. This is because the use of the alignment markers 60b,60b' can effectively prevent a cumulative risk of the misalignment regarding the constituent elements of the image display device. In this regard, it is preferred that a partially removed portion of the metal foil is provided, the removed portion being provided on the alignment marker. Such partial removal of the metal foil enables the alignment marker to be identified by means of the visible light ray. The partial removal of the metal foil disposed on the alignment marker can be performed together with the patterning process of the metal foil, and thus the number of the processes is not substantially increased by such removal.

Subsequent to the formation of the light emitting layer 170, a transparent electroconductive layer 180 (e.g., ITO film) is formed so as to cover the light emitting layers 170. The transparent electroconductive layer consisting of the ITO film can be formed by performing a sputtering process.

Through the above processes, there can be finally obtained the image display device 200 having the structures as shown in FIG. 18(e) and FIG. 16.

Figure 19:
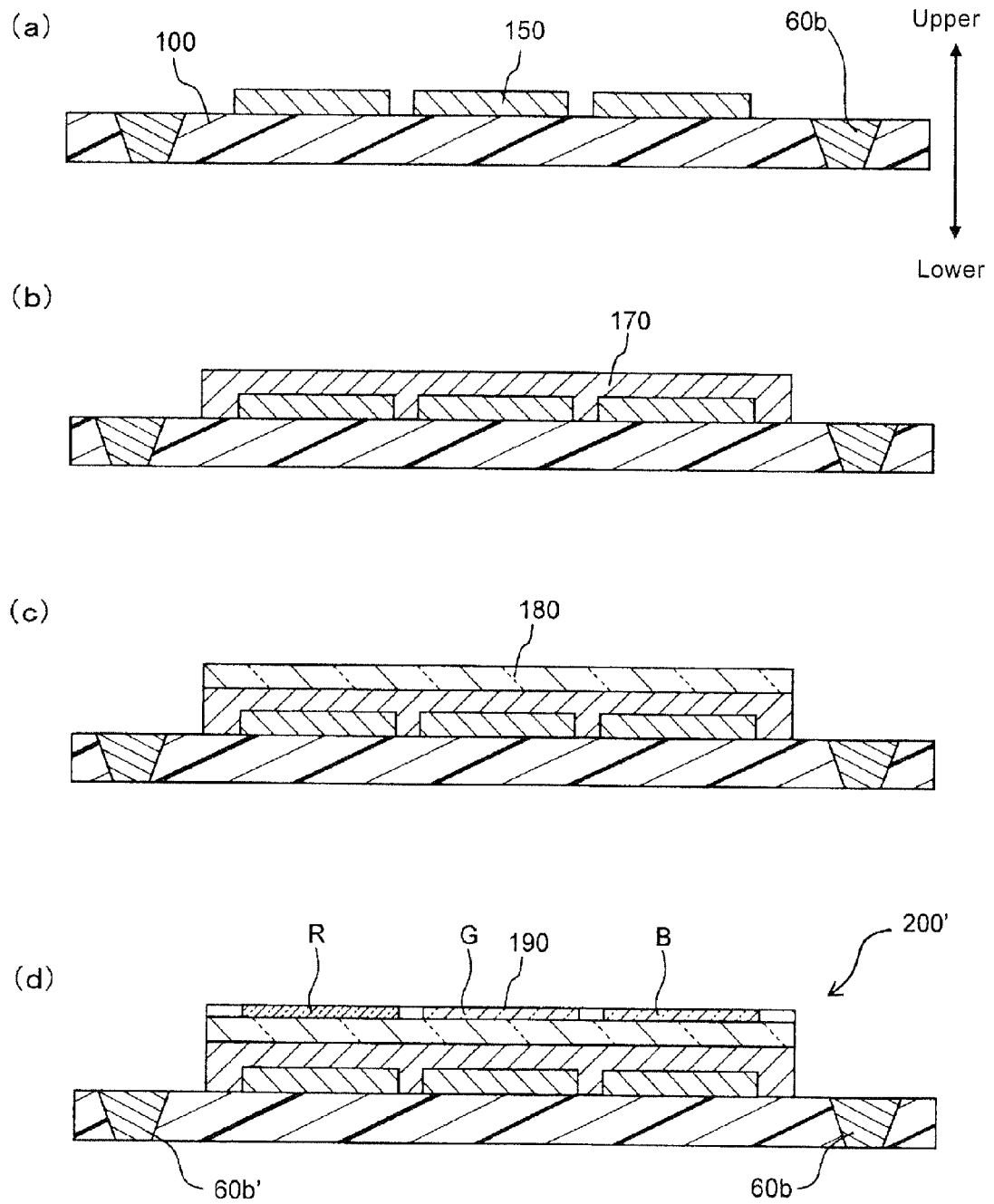
FIGS. 19(a) to 19(d) are cross sectional views schematically illustrating the steps in a manufacturing process of an image display device equipped with a color filter.

As an alternative embodiment, the manufacturing process of the image display device 200' equipped with a color filter will now be explained. This manufacturing process is substantially the same as that of the above mentioned manufacturing process, while there are some partial differences. Specifically, after the step (I) as mentioned above (see, FIG. 19(a)), a light emitting layer 170 capable of emitting white color is wholly laminated in the form of a film (see FIG. 19(b)). Subsequently, a transparent electrode layer 180 is formed in the same manner as mentioned above (see FIG.

19(c)). Thereafter, the color filter 190 capable of emitting R (red), G (green) and B (blue) is formed such that each color of the filter is arranged at each of the corresponding pixel positions (see FIG. 19(d)). As a result of the above processes, there can be finally obtained the image display device 200'. Upon the arrangement of the color filter 190, the alignment markers 60b,60b' of the flexible semiconductor device can be used. The use of the alignment markers 60b,60b' can effectively prevent a cumulative risk of the misalignment regarding the constituent elements of the image display device. In this regard, the removal of a part of the metal foil is preferred, the part being provided on the alignment marker. This is because such removal enables the alignment marker to be identified by means of the visible light ray. The partial removal of the metal foil disposed on the alignment marker can be performed together with the patterning process of the metal foil, and thus the number of the processes is not substantially increased by such removal.

Although a few embodiments of the present invention have been hereinbefore described, the present invention is not limited to these embodiments. It will be readily appreciated by those skilled in the art that various modifications are possible without departing from the scope of the present invention. For example, the following modified embodiments are possible.

Instead of the embodiment where the contact via and the alignment marker are individually provided, another embodiment may be possible where a part of the contact vias is the alignment marker(s).

Instead of the embodiment where the alignment marker has a form of "via", another embodiment may be possible where the alignment marker has a form of "throughhole" in which metal film (e.g., copper film) may be provided on an inner-wall surface of the opening by a non-electrolytic plating.

The present invention is not particularly limited to the embodiment where the resin film is laminated to form the flexible film layer of the flexible semiconductor device. Another embodiment may be possible where the formation of the flexible film layer is performed through an application (e.g., spin coating) of a semi-cured resin material or a photosensitive resin material.

Each pixel may comprise not only two TFT elements (the first TFT element and the second TFT element) but also more than two elements depending on the constructional design of the display. As a result, the flexible semiconductor device of the present embodiment may be modified according to such constructional design.

In each of the above embodiments, although the present invention has been described with respect to the flexible semiconductor device which is mounted on an organic EL display, the flexible semiconductor device of the present invention may be mounted on an inorganic EL display. Moreover, the flexible semiconductor device may be mounted not only on the EL display but also on an electronic paper. Furthermore, it is possible that the flexible semiconductor device of the present invention is mounted not only on the display device but also on communication facilities (e.g., RFID), memories and so on.

The several embodiments wherein each one flexible semiconductor device is manufactured in the form corresponding to one device have been described above. While not being limited thereto, the present invention can be performed such that the flexible semiconductor devices are manufactured in the form corresponding to two or more devices. As an example of such manufacturing form, a roll-to-roll process may be adopted.

INDUSTRIAL APPLICABILITY

Figure 20:
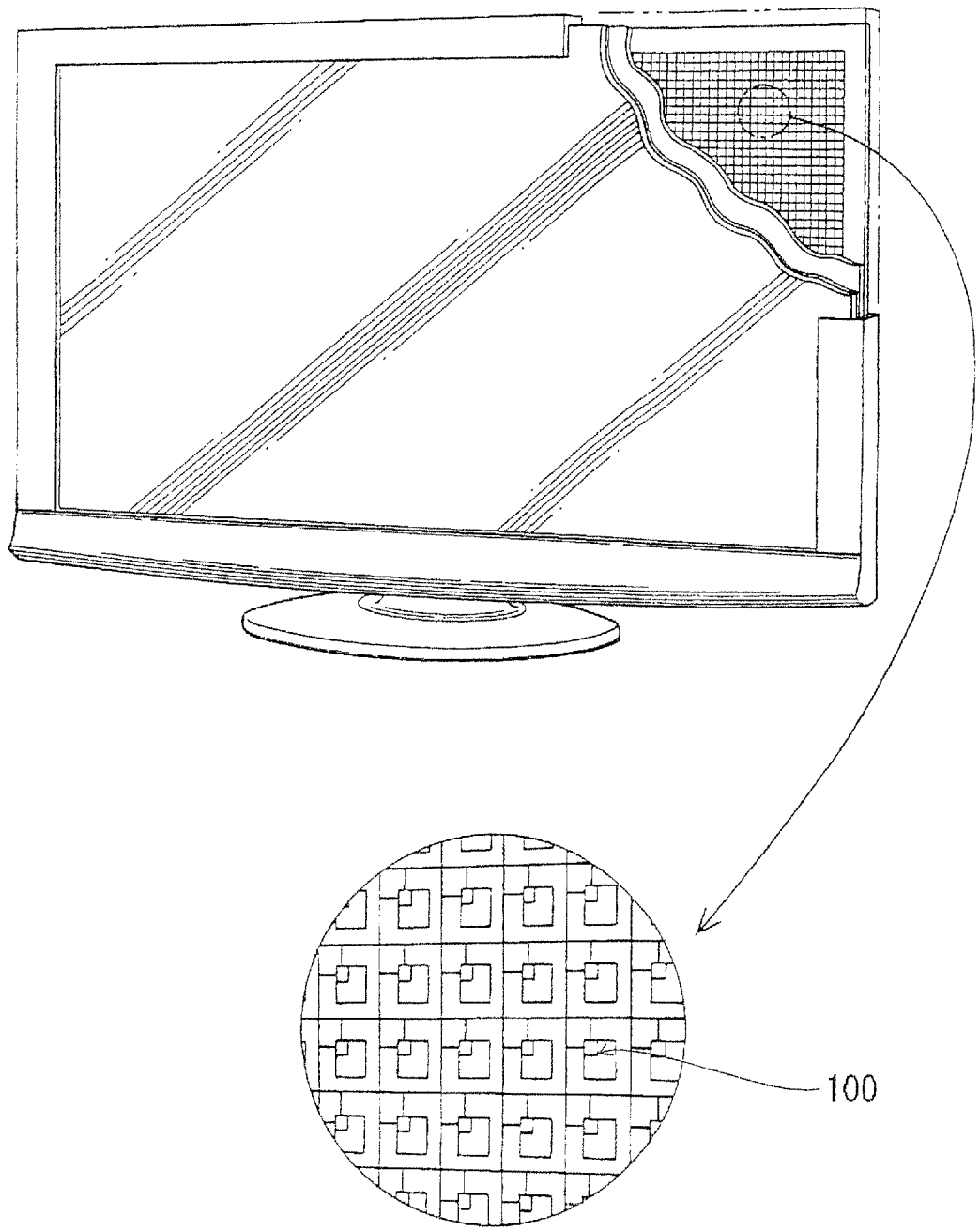
FIG. 20 is a schematic view illustrating an example of a product (an image display part of a television) wherein the flexible semiconductor device is used.
Figure 21:
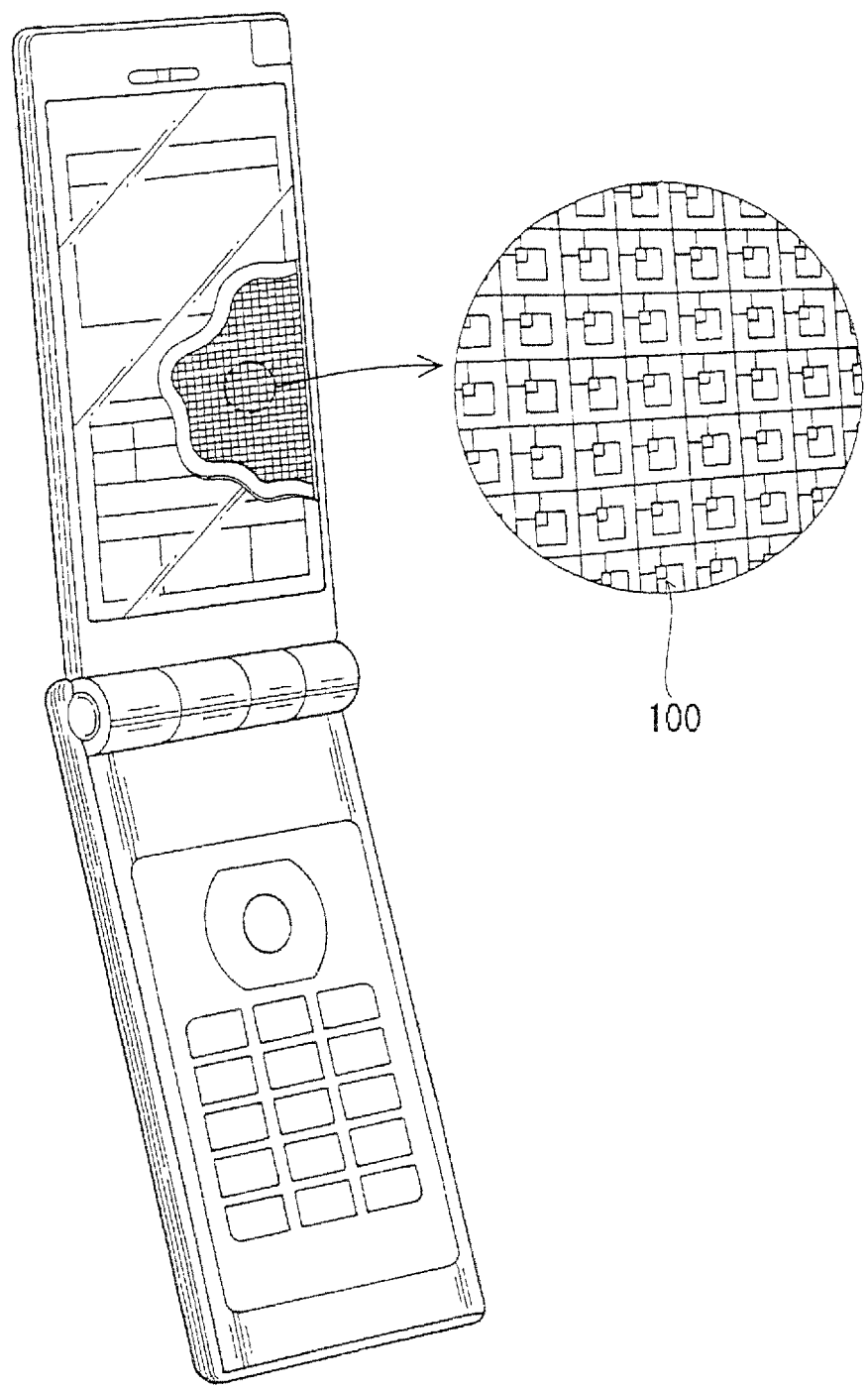
FIG. 21 is a schematic view illustrating an example of a product (an image display section of a cellular phone) wherein the flexible semiconductor device of the present invention is used.
Figure 22:
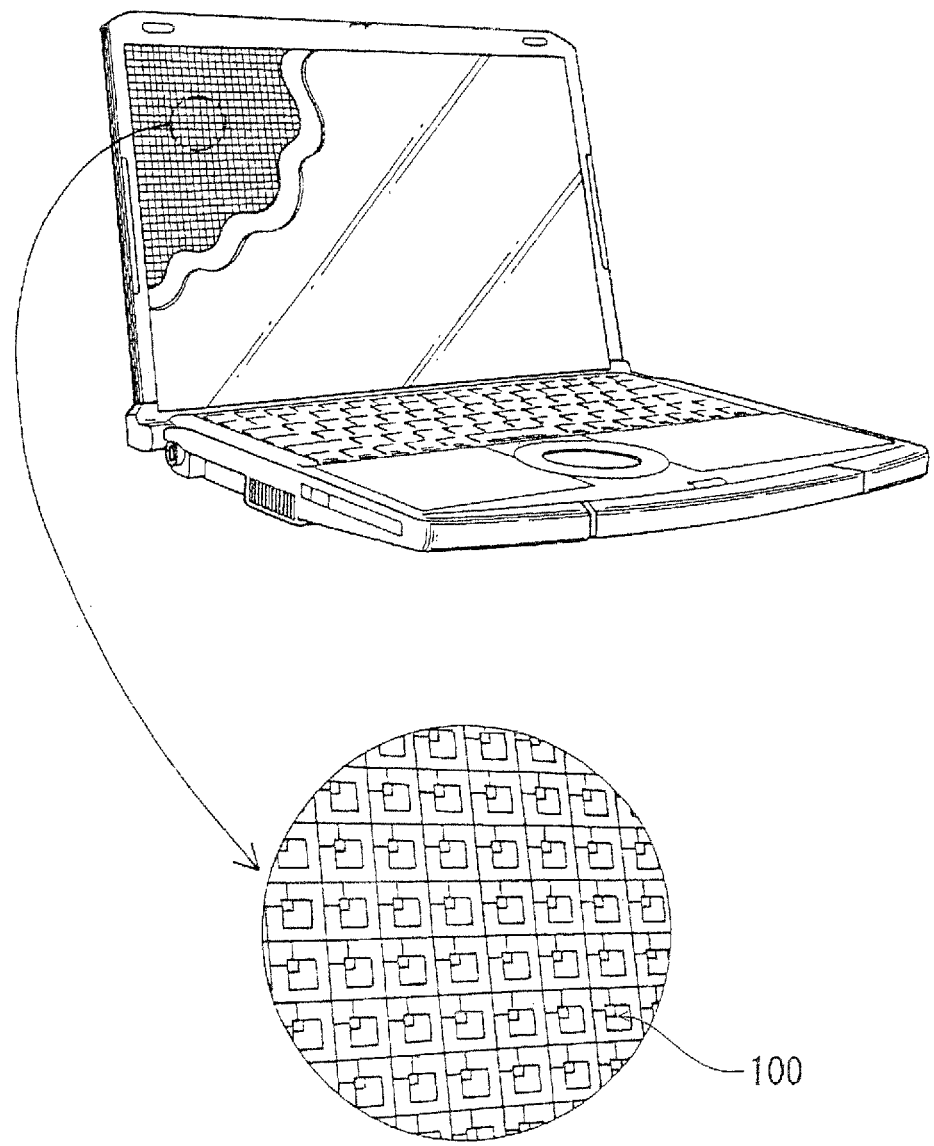
FIG. 22 is a schematic view illustrating an example of a product (an image display section of a mobile personal computer or a laptop computer) wherein the flexible semiconductor device of the present invention is used.
Figure 23:
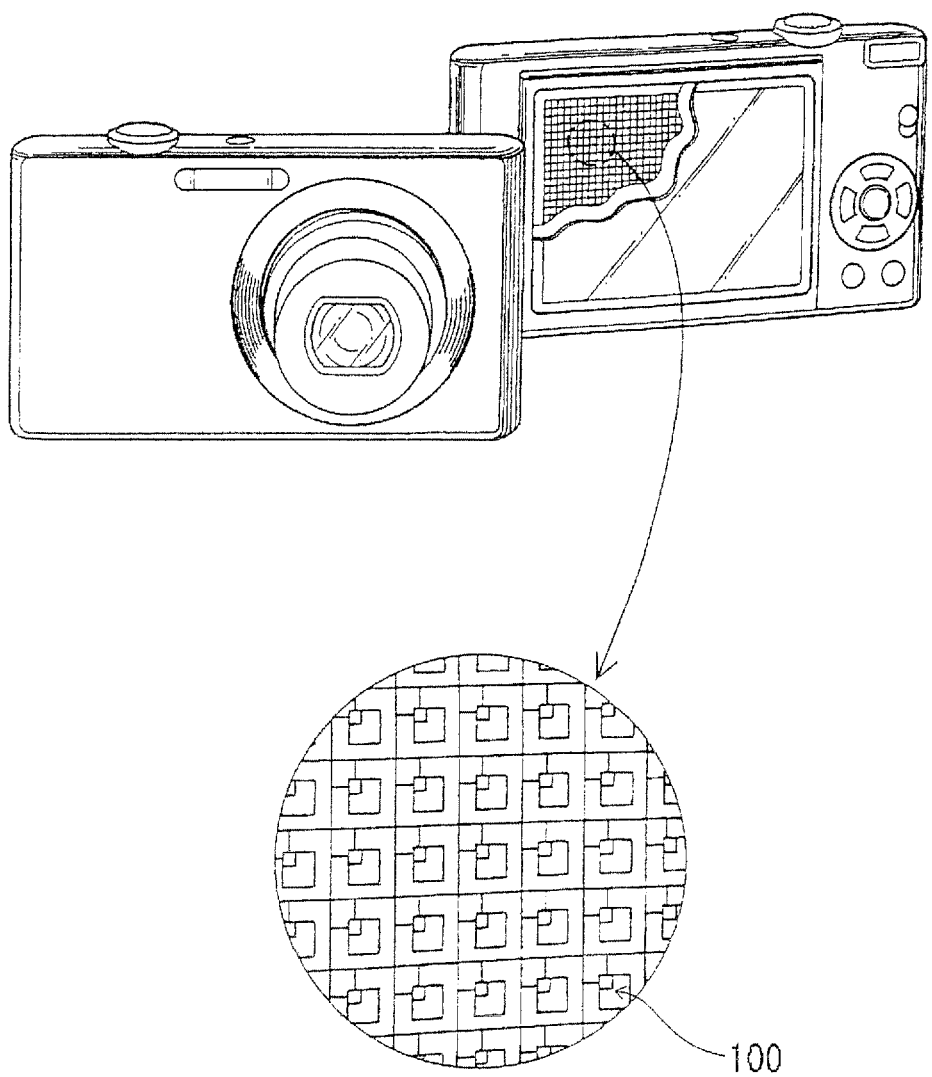
FIG. 23 is a schematic view illustrating an example of a product (an image display section of a digital still camera) wherein the flexible semiconductor device of the present invention is used.
Figure 24:
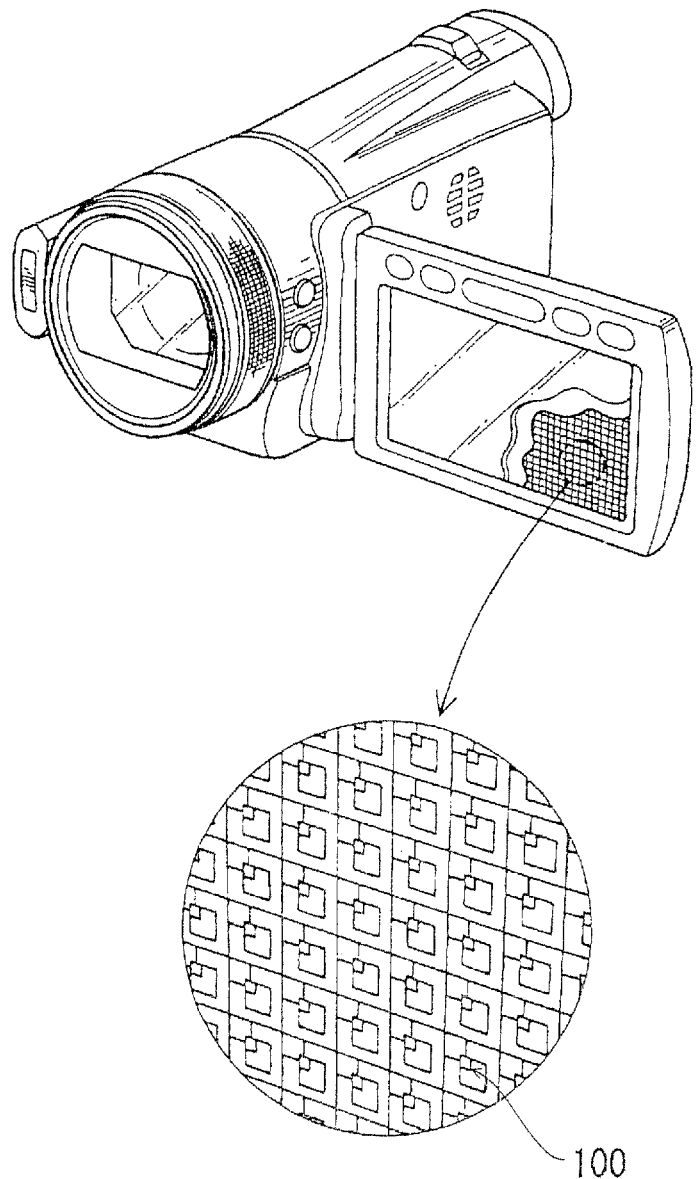
FIG. 24 is a schematic view illustrating an example of a product (an image display section of a camcorder) wherein the flexible semiconductor device of the present invention is used.
Figure 25:
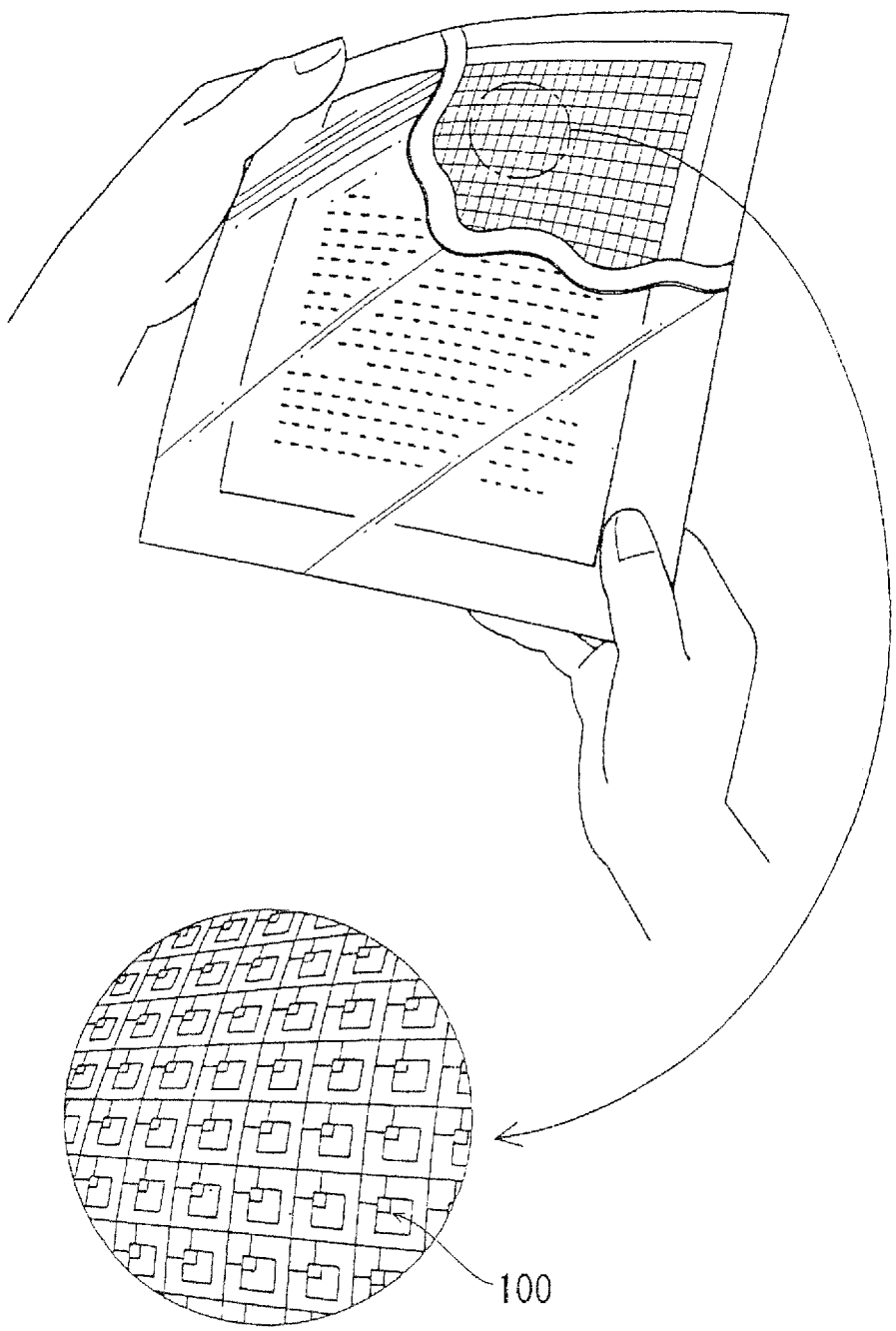
FIG. 25 is a schematic view illustrating an example of a product (an image display section of an electronic paper) wherein the flexible semiconductor device of the present invention is used.

The manufacturing method of the flexible semiconductor device of the present invention is excellent in the productivity of a flexible semiconductor device. The resulting flexible semiconductor device can also be used for various image display parts (i.e., image display device), and also can be used for an electronic paper, a digital paper and so forth. For example, the flexible semiconductor device can be used for a television picture indicator as shown in FIG. 20, the image display part of a cellular phone as shown in FIG. 21, the image display part of a mobile personal computer or a notebook computer as shown in FIG. 22, the image display part of a digital still camera and a camcorder as shown in FIGS. 23 and 24, the image display part of an electronic paper as shown in FIG. 25 and so forth. The flexible semiconductor device obtained by the manufacturing method of the present invention can also be adapted for the various uses (for example, RF-ID, a memory, MPU, a solar battery, a sensor and so forth) which application is now considered to be adapted by the printing electronics.

CROSS REFERENCE TO RELATED PATENT APPLICATION

The present application claims the right of priority of Japan patent application No. 2011-66139 (filing date: Mar. 24, 2011, title of the invention: FLEXIBLE SEMICONDUCTOR DEVICE, METHOD FOR MANUFACTURING THE SAME, IMAGE DISPLAY DEVICE USING THE SAME AND METHOD FOR MANUFACTURING THE IMAGE DISPLAY DEVICE), the whole contents of which are incorporated herein by reference.

The invention claimed is:

1. A method for manufacturing a flexible semiconductor device, comprising the steps of:
    (i) forming an insulating layer on one of principal surfaces of a metal foil;
    (ii) forming a semiconductor layer on the insulating layer, and then forming source and drain electrodes so that the source and drain electrodes contact with the semiconductor layer;
    (iii) forming a flexible film layer so that the flexible film layer covers the semiconductor layer and the source and drain electrodes;
    (iv) forming vias in the flexible film layer, and thereby a semiconductor device precursor is provided; and
    (v) subjecting the metal foil to a processing treatment, and thereby forming a gate electrode from the metal foil,
    wherein, in the step (v) of the processing treatment of the metal foil, the gate electrode is formed in a predetermined position by using at least one of the vias of the semiconductor device precursor as an alignment marker.

2. The method according to claim 1, wherein the step (v) comprising:
    (v1) forming a photo-resist film on the other of the principal surfaces of the metal foil;
    (v2) subjecting the photo-resist film to a light-exposure treatment and a developing treatment, and thereby removing at least part of the photo-resist film; and
    (v3) subjecting the metal foil to an etching treatment via the photo-resist film at least part of which has been removed, and thereby forming the gate electrode from the metal foil,
    wherein, in the step (v2) of the light-exposure treatment of the photo-resist film, a predetermined position of the photo-resist film is exposed to the light by using the at least one of the vias of the semiconductor device precursor as the alignment marker.

3. The method according to claim 2, wherein, in the step (v2), a photomask is disposed on the photo-resist film, and thereafter the photo-resist film with the photomask disposed thereon is subjected to the light-exposure and developing treatments to remove at least part of the photo-resist film; and instead of using the alignment marker when subjecting the photo-resist film to the light-exposure treatment, an alignment of the photomask is performed upon the disposing thereof by using the at least one of the vias of the semiconductor device precursor as the alignment marker.

4. The method according to claim 1, wherein, in the step (iv) of forming the via, an opening is formed in the flexible film layer, and thereafter an electrically-conductive material with a metal contained therein is supplied into the opening to form the via.

5. The method according to claim 1, wherein, upon the processing treatment of the metal foil, the light-exposure treatment of the photo-resist film or the disposing of the photomask, a X-ray transmission image obtained by irradiating the semiconductor device precursor with a X-ray is used wherein a via-corresponding point in the X-ray transmission image is used as a positioning reference.

6. The method according to claim 5, wherein, at least two of the vias are used as a unit which constitutes the alignment marker; and the via-corresponding points in the X-ray transmission image, which correspond to the vias of the unit, are used as the positioning reference.

7. A flexible semiconductor device comprising:
a metal foil;
an insulating layer provided on the metal foil;
a semiconductor layer provided on the insulating layer;
source and drain electrodes provided on the insulating layer, the source and drain electrodes being in contact with the semiconductor layer; and
a flexible film layer disposed such that the semiconductor layer and the source and drain electrodes are covered with the flexible film layer,
wherein a part of the metal foil is a gate electrode, and a part of the insulating layer is a gate insulating film, and
wherein the flexible film layer is provided with a plurality of vias extending in a thickness direction thereof, at least one of the vias being an alignment marker.

8. The flexible semiconductor device according to claim 7, wherein the alignment marker is provided as a unit of at least two of the vias.

9. A flexible semiconductor device comprising:
a metal foil;
an insulating layer provided on the metal foil;
a semiconductor layer provided on the insulating layer;
source and drain electrodes provided on the insulating layer, the source and drain electrodes being in contact with the semiconductor layer; and
a flexible film layer disposed such that the semiconductor layer and the source and drain electrodes are covered with the flexible film layer,
wherein a part of the metal foil is a gate electrode, and a part of the insulating layer is a gate insulating film, and
wherein the flexible film layer is provided with a plurality of vias extending in a thickness direction thereof, and the partially removed portion of the metal foil is provided at a position of at least one of the vias.

10. The flexible semiconductor device according to claim 9, wherein the insulating layer has an upper principal surface and a lower principal surface opposed to the upper principal surface, the upper principal surface being in contact with the flexible film layer, and wherein the at least one of the vias extends such that it reaches the lower principal surface of the insulating layer.

11. The flexible semiconductor device according to claim 7, wherein the at least one of the vias is an electrically-conductive part which comprises a metal.

12. The flexible semiconductor device according to claim 7, wherein the at least one of the vias has a taper shape in a thickness direction thereof.

13. The flexible semiconductor device according to claim 7, wherein the at least one of the vias extends from one of the principal surfaces of the flexible film layer to the other of the principal surfaces thereof.

14. A flexible semiconductor device comprising:
a metal layer;
an insulating layer provided on the metal layer;
a semiconductor layer provided on the insulating layer;
source and drain electrodes provided on the insulating layer, the source and drain electrodes being in contact with the semiconductor layer; and
a flexible film layer disposed such that the semiconductor layer and the source and drain electrodes are covered with the flexible film layer,
wherein a part of the metal layer is a gate electrode, and a part of the insulating layer is a gate insulating film, and
wherein the flexible film layer is provided with a plurality of vias extending in a thickness direction thereof, and at least one of the vias being an alignment marker.

15. A flexible semiconductor device comprising:
a metal layer;
an insulating layer provided on the metal layer;
a semiconductor layer provided on the insulating layer;
source and drain electrodes provided on the insulating layer, the source and drain electrodes being in contact with the semiconductor layer; and
a flexible film layer disposed such that the semiconductor layer and the source and drain electrodes are covered with the flexible film layer,
wherein a part of the metal layer is a gate electrode, and a part of the insulating layer is a gate insulating film, and
wherein the flexible film layer is provided with a plurality of vias extending in a thickness direction thereof, and a partially removed portion of the metal layer is provided at a position of at least one of the vias.

16. An image display device using the flexible semiconductor device according to claim 7, the image display device comprising:
the flexible semiconductor device; and
an image display unit composed of a plurality of pixels, the unit being provided over the flexible semiconductor device,
wherein at least one of the vias provided in the flexible semiconductor device is an alignment marker.

17. The image display device according to claim 16, wherein the image display unit comprises:
a pixel electrode provided on the flexible semiconductor device;
a light emitting layer provided over the pixel electrode; and
a transparent electrode layer provided on the light emitting layer.

18. The image display device according to claim 17, wherein the light emitting layer is provided at a region partitioned by a pixel regulating part.

19. The image display device according to claim 17, wherein a color filter is provided on the transparent electrode layer.

20. A method for manufacturing an image display device using the flexible semiconductor device according to claim 7, the method comprising the steps of:
(I) providing the flexible semiconductor device equipped with a pixel electrode; and
(II) forming an image display unit composed of a plurality of pixels over the flexible semiconductor device,
wherein, in the step (II), an alignment of the image display unit is performed upon the formation thereof by using at least one of the vias of the flexible semiconductor device as an alignment marker.

21. The method according to claim 20, wherein, in the step (II), a plurality of pixel regulating parts are formed, and then the pixels are formed on regions of the pixel electrode, the regions being partitioned by the pixel regulating parts, and
wherein, in the step (II), an alignment of the pixel regulating parts is performed upon the formation thereof by using at least one of the vias of the flexible semiconductor device as the alignment marker.

22. The method according to claim 20, wherein, in the step (II), a light emitting layer is formed over the pixel electrode such that the light emitting layer covers the pixel electrode, and then a color filter is formed on the light emitting layer, and
wherein, in the step (II), an alignment of the color filter is performed upon the formation thereof by using at least one of the vias of the flexible semiconductor device as the alignment marker.

23. The flexible semiconductor device according to claim 9, wherein the at least one of the vias is an electrically-conductive part which comprises a metal.

24. The flexible semiconductor device according to claim 9, wherein the at least one of the vias has a taper shape in a thickness direction thereof.

25. The flexible semiconductor device according to claim 9, wherein the at least one of the vias extends from one of the principal surfaces of the flexible film layer to the other of the principal surfaces thereof.

26. An image display device using the flexible semiconductor device according to claim 9, the image display device comprising:
the flexible semiconductor device; and
an image display unit composed of a plurality of pixels, the unit being provided over the flexible semiconductor device,
wherein at least one of the vias provided in the flexible semiconductor device is an alignment marker.

27. An image display device using the flexible semiconductor device according to claim 14, the image display device comprising:
the flexible semiconductor device; and
an image display unit composed of a plurality of pixels, the unit being provided over the flexible semiconductor device,
wherein at least one of the vias provided in the flexible semiconductor device is an alignment marker.

28. An image display device using the flexible semiconductor device according to claim 15, the image display device comprising:
the flexible semiconductor device; and
an image display unit composed of a plurality of pixels, the unit being provided over the flexible semiconductor device,
wherein at least one of the vias provided in the flexible semiconductor device is an alignment marker.

29. A method for manufacturing an image display device using the flexible semiconductor device according to claim 9, the method comprising the steps of:
(I) providing the flexible semiconductor device equipped with a pixel electrode; and
(II) forming an image display unit composed of a plurality of pixels over the flexible semiconductor device,
wherein, in the step (II), an alignment of the image display unit is performed upon the formation thereof by using at least one of the vias of the flexible semiconductor device as an alignment marker.

30. A method for manufacturing an image display device using the flexible semiconductor device according to claim 14, the method comprising the steps of:
(I) providing the flexible semiconductor device equipped with a pixel electrode; and
(II) forming an image display unit composed of a plurality of pixels over the flexible semiconductor device,
wherein, in the step (II), an alignment of the image display unit is performed upon the formation thereof by using at least one of the vias of the flexible semiconductor device as an alignment marker.

31. A method for manufacturing an image display device using the flexible semiconductor device according to claim 15, the method comprising the steps of:
(I) providing the flexible semiconductor device equipped with a pixel electrode; and
(II) forming an image display unit composed of a plurality of pixels over the flexible semiconductor device,
wherein, in the step (II), an alignment of the image display unit is performed upon the formation thereof by using at least one of the vias of the flexible semiconductor device as an alignment marker.

* * * * *